(12) United States Patent  (10) Patent No.: US 8,044,686 B2
Yamamoto et al.  (45) Date of Patent: Oct. 25, 2011

(54) COMPARATOR CIRCUIT FOR GENERATING BINARIZED DATA

(75) Inventors: Tatsuya Yamamoto, Chigasaki (JP); Tsuneo Suzuki, Kamakura (JP); Yuusuke Maeda, Kawasaki (JP); Souichi Honma, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/613,153

(22) Filed: Nov. 5, 2009

(65) Prior Publication Data

US 2010/0052733 A1  Mar. 4, 2010

Related U.S. Application Data

(62) Division of application No. 12/163,175, filed on Jun. 27, 2008, now Pat. No. 7,633,320.

(30) Foreign Application Priority Data

Jun. 29, 2007 (JP) ................................. 2007-171821
Apr. 1, 2008 (JP) ................................. 2008-094599

(51) Int. Cl.
*H03K 5/22* (2006.01)

(52) U.S. Cl. ............... 327/58; 327/60; 327/62; 327/72; 327/307; 330/9

(58) Field of Classification Search .................. 327/58, 327/60, 62, 72, 307; 330/9
See application file for complete search history.

(56) References Cited

U.S. PATENT DOCUMENTS 4,433,256 A * 2/1984 Dolikian ..................... 327/73
4,821,292 A 4/1989 Childress
5,050,190 A 9/1991 Shimada et al.
5,159,340 A * 10/1992 Smith ......................... 341/132
5,381,052 A 1/1995 Kolte
5,392,317 A 2/1995 Cho et al.
5,506,411 A * 4/1996 Tasaki ........................ 250/568
6,215,334 B1 4/2001 Pernyeszi
6,587,004 B2 * 7/2003 Ide ............................. 330/308
6,595,708 B1 * 7/2003 Yamashita ................ 398/202
6,646,479 B1 11/2003 Crawford
6,735,260 B1 5/2004 Eliezer et al.
7,382,166 B1 * 6/2008 Ide ............................. 327/62
7,503,497 B2 * 3/2009 Takahashi et al. ....... 235/462.27
2007/0150267 A1 6/2007 Honma et al.

FOREIGN PATENT DOCUMENTS

JP 63-167519 A 7/1988
JP 63-277931 A 11/1988
JP 05-252009 A 9/1993
JP 06-004063 Y2 2/1994
JP 06-283982 A 10/1994

* cited by examiner

*Primary Examiner* — Kenneth B. Wells
(74) *Attorney, Agent, or Firm* — Foley & Lardner LLP

(57) ABSTRACT

A comparator circuit according to an embodiment of the present invention includes a comparator configured to compare an input signal voltage with a reference voltage obtained by smoothing the input signal by use of a resistor and a capacitor, and output a result of the comparison, a discharge circuit configured to compare a first addition signal which is obtained by adding a positive first voltage to the input signal voltage, with the reference voltage, and discharge the capacitor when the first addition signal is lower than the reference voltage, and a charge circuit configured to compare a second addition signal which is obtained by adding a negative second voltage to the input signal voltage, with the reference voltage, and charge the capacitor when the second addition signal is higher than the reference voltage.

9 Claims, 30 Drawing Sheets

COMPARATOR CIRCUIT FOR GENERATING BINARIZED DATA

CROSS REFERENCE TO RELATED APPLICATION

This application is a Divisional of U.S. Ser. No. 12/163,175, filed Jun. 27, 2008, now U.S. Pat. No. 7,633,320, which is based upon and claims the benefit of priority from the prior Japanese Patent Application No. 2007-171821, filed on Jun. 29, 2007 and the prior Japanese Patent Application No. 2008-94599, filed on Apr. 1, 2008, the entire contents of which are incorporated herein by reference.

BACKGROUND OF THE INVENTION

1. Field of the Invention

The present invention relates to a comparator circuit, for example, a comparator circuit for an FSK (frequency shift keying) demodulation circuit, and a comparator circuit suited to binarizing an ASK (amplitude shift keying) signal demodulated using an RSSI (received signal strength indicator).

2. Background Art

In demodulating an FSK signal, it is common practice to remove a signal component included in the FSK signal to extract a DC component, deal with the extracted component as an average voltage of the FSK signal, and compare this voltage as a threshold voltage with the FSK signal, to generate binarized data.

In general, the average voltage is obtained using a primary low-pass filter including a resistor and a capacitor. The cut-off frequency of the low-pass filter is required to be sufficiently lower than the frequency of the signal component included in the FSK signal. For this reason, the capacitance of the capacitor becomes large, time for charging and discharging becomes long, the rise of the average voltage becomes slow, and hence it takes a long time to obtain the binarized data. Therefore, when the input signal voltage Vin varies, the average voltage Vref cannot adapt to it rapidly, due to the time constant of the primary low-pass filter including the resistor and the capacitor.

Particularly in a system which operates on battery, shortening the rise time is important for extending battery life, and therefore a charge/discharge circuit that rapidly charges and discharges the capacitor is required. To realize this, there has been used a technique that involves charging and discharging the capacitor by use of a diode.

However, with this arrangement, the signal voltage applied during charging or discharging the capacitor is constrained to the forward voltage VF of the diode. That is, in a case where Vin–Vref, which is obtained by subtracting the average voltage Vref from the input signal voltage Vin, is a positive value, the capacitor is charged when this value becomes larger than the forward voltage VF, whereas in a case where Vin–Vref is a negative value, the capacitor is discharged when this value becomes smaller than the forward voltage –VF. However, it is impossible to set arbitrarily a voltage at which charging/discharging is started, and therefore this voltage is fixed at ±VF.

Further, the forward voltage VF of a diode is about as large as 0.6 V, and it has been difficult to adapt to the reduction of the signal amplitude resulting from the recent trend toward low power-supply voltages. In addition, the forward voltage VF depends on temperature (–2 mV/° C.), and it has been difficult to obtain high reliability.

JP-A H5-252009 (KOKAI) describes an example of a slice level generating circuit including first and second operational amplifiers and first and second diodes.

Further, in demodulating an FSK signal or an AKS signal, it is common practice to generate an average voltage of the FSK signal or the AKS signal as a threshold, and compare the FSK signal or the AKS signal with the threshold, to binarize the FSK signal or the AKS signal.

In generating the average voltage, there is available a method that involves using a primary low-pass filter including a resistor and a capacitor. In this method that involves using the primary low-pass filter, if the cut-off frequency is set at a value sufficiently lower than the signal frequency to prevent the attenuation of the FSK signal or the ASK signal, the rise of the average voltage becomes slow and it takes a long time before the binarization is completed.

For this reason, when the method is applied to a system that operates on battery, the consumption of the battery becomes severe, the battery needs to be replaced frequently, and hence the usability of the system becomes poor.

SUMMARY OF THE INVENTION

An aspect of the present invention is, for example, a comparator circuit including a comparator configured to compare an input signal voltage with a reference voltage obtained by smoothing the input signal by use of a resistor and a capacitor, and output a result of the comparison, a discharge circuit configured to compare a first addition signal which is obtained by adding a positive first voltage to the input signal voltage, with the reference voltage, and discharge the capacitor when the first addition signal is lower than the reference voltage, and a charge circuit configured to compare a second addition signal which is obtained by adding a negative second voltage to the input signal voltage, with the reference voltage, and charge the capacitor when the second addition signal is higher than the reference voltage.

BRIEF DESCRIPTION OF THE DRAWINGS

FIG. 19-1 is a diagram showing the RSSI waveform during a weak input before clipping in the charge/discharge circuit of FIG. 15;

FIG. 19-2 is a diagram showing the RSSI waveform during a weak input after clipping in the charge/discharge circuit of FIG. 15;

FIG. 20-1 is a diagram showing the RSSI waveform during a strong input before clipping in the charge/discharge circuit of FIG. 15;

FIG. 20-2 is a diagram showing the RSSI waveform during a strong input after clipping in the charge/discharge circuit of FIG. 15;

FIG. 21-1 is a circuit diagram showing a schematic configuration of a peak hold circuit which is applied to a charge/discharge circuit of a sixth embodiment;

FIG. 21-2 is a circuit diagram showing a schematic configuration of a peak hold circuit which is applied to a charge/discharge circuit of a seventh embodiment;

FIG. 23-1 is a circuit diagram showing a schematic configuration of a clipping circuit which is applied to a charge/discharge circuit of a ninth embodiment;

FIG. 23-2 is a circuit diagram showing a schematic configuration of a clipping circuit which is applied to a charge/discharge circuit of a tenth embodiment;

FIG. 27-1 is a diagram showing the RSSI waveform during a weak input after clipping in the charge/discharge circuit of FIG. 25;

FIG. 27-2 is a diagram showing the RSSI waveform during a strong input after clipping in the charge/discharge circuit of FIG. 25;

FIG. 28-1 is a circuit diagram showing a schematic configuration of a charge/discharge section which is applied to a charge/discharge circuit of a thirteenth embodiment;

FIG. 28-2 is a circuit diagram showing a schematic configuration of a charge/discharge section which is applied to a charge/discharge circuit of a fourteenth embodiment;

DESCRIPTION OF THE EMBODIMENTS

Embodiments of the present invention will be described below with reference to the accompanying drawings.

First, a description will be given regarding the configuration of an FSK receiving circuit including a comparator circuit of an embodiment of the present invention, with reference to FIG. 1.

A signal received by an antenna (ANT) 101 is amplified by a low-noise amplifier (LNA) 102. Then, the frequency of the received signal is lowered by a mixer (MIX) 103. Then, components except an intermediate frequency (IF) are removed from the received signal by an IF filter (IFF) 104.

After that, the received signal is amplified by an IF amplifier (IF_AMP) 105, and detected by an FM detector (DET) 106. Then, only necessary low-frequency components of the received signal pass through a low-pass filter (LPF) 107. Furthermore, the voltage of the filtered signal is compared, by a comparator (COMP) circuit 108, with an average voltage which is obtained by removing signal components from the filtered signal, and a signal is outputted.

A description will be given regarding a comparator circuit of a first embodiment, which is applied to the comparator circuit 108 in the above FSK receiving circuit.

First Embodiment

Figure 2:
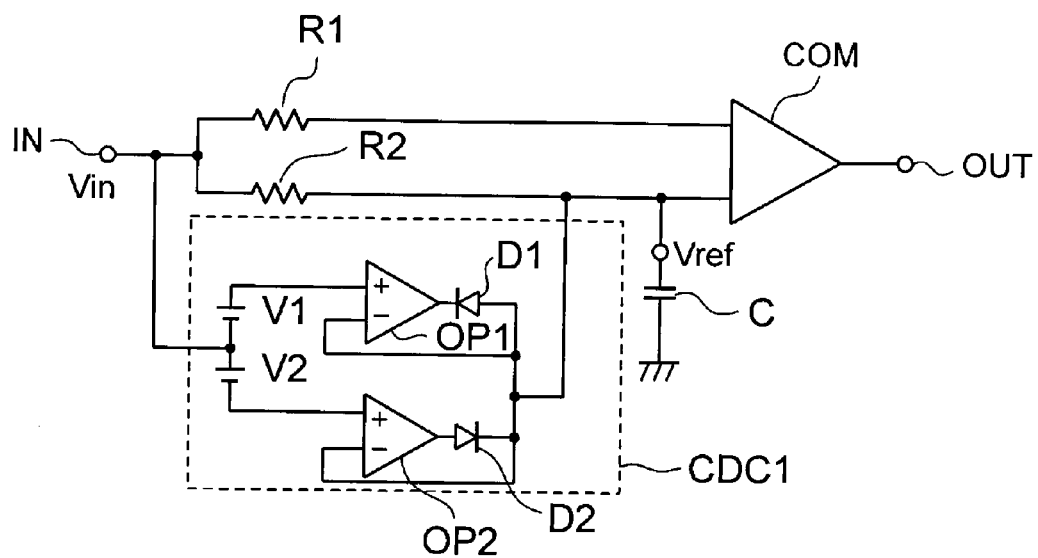
FIG. 2 is a block diagram showing the configuration of the comparator circuit according to the first embodiment.

FIG. 2 shows the configuration of a comparator circuit in the first embodiment.

In the FM detection by the above FSK receiving circuit, the DC voltage of a detection output varies in proportion to the input frequency. Therefore, the DC voltage varies when a change from a no-signal condition to a condition in which a signal is present occurs, and the comparator circuit 108 is required to adapt to this change rapidly.

This comparator circuit 108 has a comparator COM whose first and second input terminals are connected to resistors R1 and R2, respectively, and an input signal voltage Vin is input to the first and second input terminals via an input terminal IN.

A capacitor C is connected between the second input terminal and a ground terminal. An average voltage Vref which is used for comparison is generated at the second input terminal by a low-pass filter including the resistor R2 and the capacitor C. A charge/discharge circuit CDC1 is provided to rapidly charge and discharge the capacitor C.

The charge/discharge circuit CDC1 is provided with an operational amplifier OP1, a voltage V1, and a diode D1 for discharging, and provided with an operational amplifier OP2, a voltage V2, and a diode D2 for charging, between the input terminal IN and the second terminal of the comparator COM.

The operational amplifier OP1 has a non-inverting input terminal to which the input signal voltage Vin+V1 is input, and an inverting input terminal to which the average voltage Vref is input. When Vin+V1<Vref, a current flows from the capacitor C to the diode D1, and flows from an output terminal of the operational amplifier OP1 to the ground terminal, thereby the capacitor C is discharged.

On the other hand, the operational amplifier OP2 has a non-inverting input terminal to which the input signal voltage Vin−V2 is input, and an inverting input terminal to which the average voltage Vref is input. When Vin−V2>Vref, a current flows from a power-source terminal to an output terminal of the operational amplifier OP2, to the diode D2, and to the capacitor C, thereby the capacitor C is charged.

As described above, a discharge start voltage is set by the voltage V1 connected to the non-inverting input terminal of the operational amplifier OP1, and a charge start voltage is set by the voltage V2 connected to the non-inverting input terminal of the operational amplifier OP2. When the input signal voltage Vin becomes lower from the average voltage Vref by more than V1, the operational amplifier OP1 works to discharge the capacitor C. When the input signal voltage Vin becomes higher from the average voltage Vref by more than V2, the operational amplifier OP2 works to charge the capacitor C.

Therefore, according to the first embodiment, it is possible to set each of the charge and discharge start voltages at any value.

The voltages V1 and V2 may be set at the same level, or may be set at different values. When variations due to temperature do not occur in the voltages V1 and V2, variations due to temperature do not occur in the circuit. However, when variations due to temperature occur in the detection output level, temperature corrections can be performed by changing the voltages V1 and V2 according to variations due to temperature in the detection output level.

Figure 3:
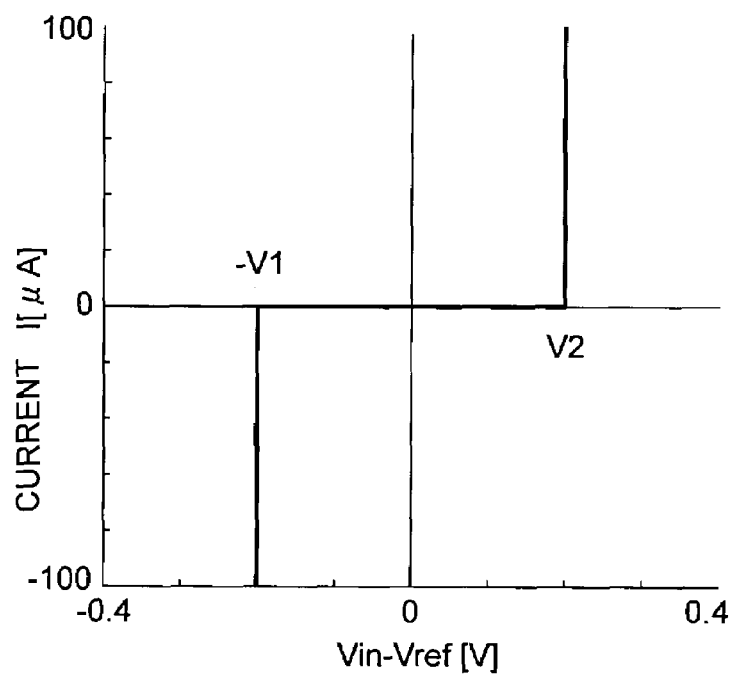
FIG. 3 is a graph showing the charge/discharge start voltage in the comparator circuit shown in FIG. 2.

FIG. 3 shows the relationship between the voltage Vin−Vref and the current I which charges and discharges the capacitor C in a circuit of the first embodiment. When the voltage Vin−Vref becomes larger than the voltage V2 (Vin−Vef>V2, i.e., Vin −V2>Vref), the capacitor C is charged. When the voltage Vin−Vref becomes smaller than the voltage −V1 (Vin−Vref<−V1, i.e., Vin+V1<Vref), the capacitor C is discharged.

When the operational amplifiers OP1 and OP2 have input DC offset voltages VOFF1 and VOFF2 respectively, they are taken into consideration in this embodiment. In this case, when the voltage Vin−Vref becomes larger than the voltage V2−VOFF2 (Vin−Vref>V2−VOFF2, i.e., Vin−(V2−VOFF2)>Vref), the capacitor C is charged. Further, when the voltage Vin−Vref becomes smaller than the voltage −V1−VOFF1 (Vin−Vref<−V1−VOFF1, i.e., Vin+(V1+VOFF1)<Vref), the capacitor is discharged. The charge and discharge start voltages when such input DC offset voltages are considered, apply also to the second to fourth embodiments below. There are offset voltages that are parasitic on a circuit, and offset voltages that are intentionally set for circuit design.

As described above, according to the first embodiment, it is possible to set the charge/discharge start voltage at any value by setting the voltage V1, V2 at any value. When there is no variation due to temperature in the voltage V1, V2, it is possible to improve the circuit characteristics without being affected by temperature variation regarding the circuit operation.

COMPARATIVE EXAMPLE

Figure 4:
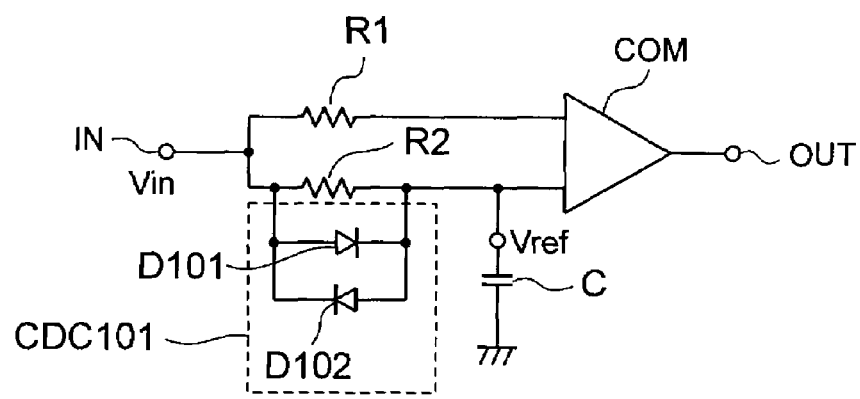
FIG. 4 is a circuit diagram showing the configuration of a comparator circuit of a comparative example.

FIG. 4 shows the configuration of a comparator circuit in a comparative example. In this circuit, diodes D101 and D102 are provided in parallel on both ends of a resistor R2, as a charge/discharge circuit CDC101 that charges and discharges a capacitor C.

When a voltage difference between the input signal voltage Vin and the average voltage Vref exceeds a forward voltage VF of the diode (Vin−Vref>VF), the capacitor C is charged. When a voltage difference between the input signal voltage Vin and the average voltage Vref becomes lower than a negative value of the forward voltage VF of the diode (Vin−Vref <−VF), the capacitor is discharged.

Figure 5:
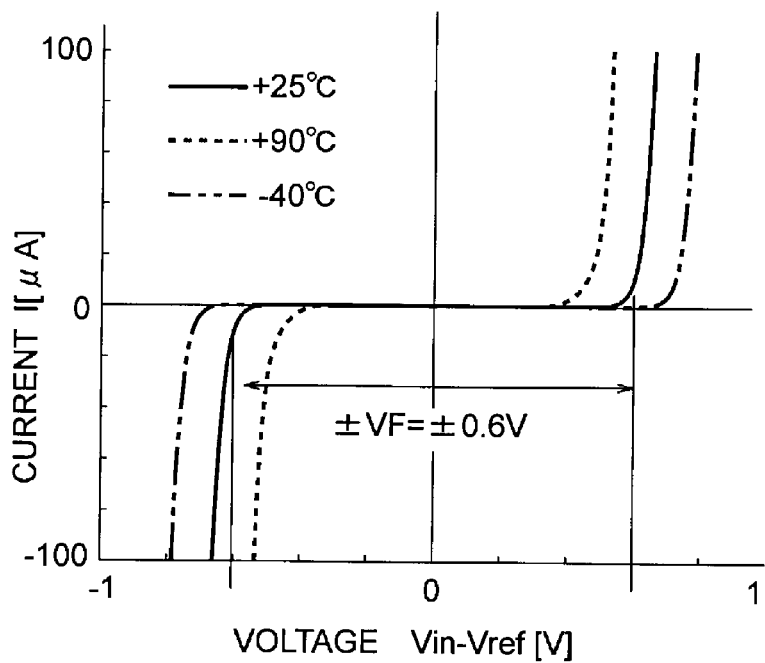
FIG. 5 is a graph showing the temperature dependence caused by a diode in the comparator circuit shown in FIG. 4.

The relationship between the voltage (Vin−Vref) and the charge/discharge current I in this case is shown in FIG. 5. The charge/discharge start voltage at which charging/discharging to the capacitor C is started, is determined by the forward voltage ±VF of the diodes D101, D102. When the temperature is 25° C., this charge/discharge start voltage becomes approximately ±0.6 V.

This value is considerably high in spite of recent requirements for low power-supply voltages, and cannot be set at any value. Furthermore, as shown in FIG. 5, since the forward voltage of a diode varies depending on temperature, the charge/discharge start voltage also varies, which causes deterioration in the circuit characteristics.

If the input signal voltage is denoted by Vin (p-p), the relationship expressed by 2×VF≦Vin (p-p)>VF must be satisfied to raise the charge/discharge speed. In particular, when 2×VF=Vin (p-p), the charge/discharge speed becomes fastest, and it is possible to make fast the rise of the average voltage Vref.

However, because the forward voltage VF varies greatly due to temperature as described, it is difficult to set the voltage so that the relationship is satisfied.

When 2×VF>Vin (p-p)>VF, the rise of the average voltage Vref becomes late and it takes a long time before the average voltage Vref reaches the level of the input signal voltage Vin. For this reason, the comparator COM starts working fast, although the duty ratio reaches 50% late.

When the relationship 2×VF<Vin (p-p) holds, the average voltage Vref fluctuates greatly, and regarding a modulated wave, the duty ratio deviates from 50%, so that errors become apt to occur in output data from the comparator COM. Furthermore, because noise occurs in the average voltage Vref, the S/N ratio deteriorates and sensitivity worsens.

When Vin (p-p)<VF, the comparator COM starts working late.

The temperature characteristics of the forward voltage VF of the diode is −2 mV/° C. Here, it is assumed VF=0.6 V at 25° C. When the temperature ±65° C. is considered on the basis of 25° C., VF=0.73 V at −40° C. and VF=0.47 V at +90° C. Therefore, a variation of 0.26 V occurs. For this reason, it is difficult to set the forward voltage VF so that the relationship 2×VF=Vin (p-p) is satisfied.

As described above, in the comparative example, the characteristics of the charge/discharge circuit are greatly influenced by the temperature characteristics of the forward voltage VF of the diode, and a large amplitude is required for the input signal voltage Vin due to the large voltage VF. Therefore, the comparator circuit cannot be used at low power-supply voltages.

Second Embodiment

Figure 6:
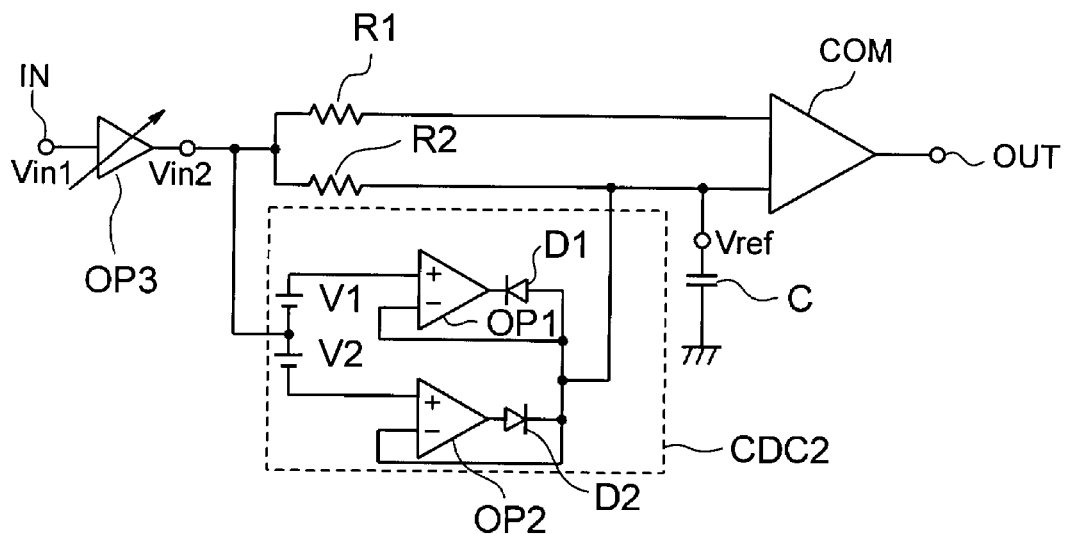
FIG. 6 is a block diagram showing the configuration of a comparator circuit in a second embodiment.

A comparator circuit in the second embodiment will be described with reference to FIG. 6 showing the configuration of the comparator circuit.

The second embodiment differs from the above-described first embodiment in that a gain-variable type operational amplifier OP3 is connected in series between the input terminal IN, and the connection point of the resistors R1 and R2 in the first embodiment.

The level of an input signal voltage Vin1 input from the input terminal IN is changed by the gain-variable type operational amplifier OP3, and the input signal voltage Vin1 is output to the succeeding stage as an input signal Vin2.

Figure 1:
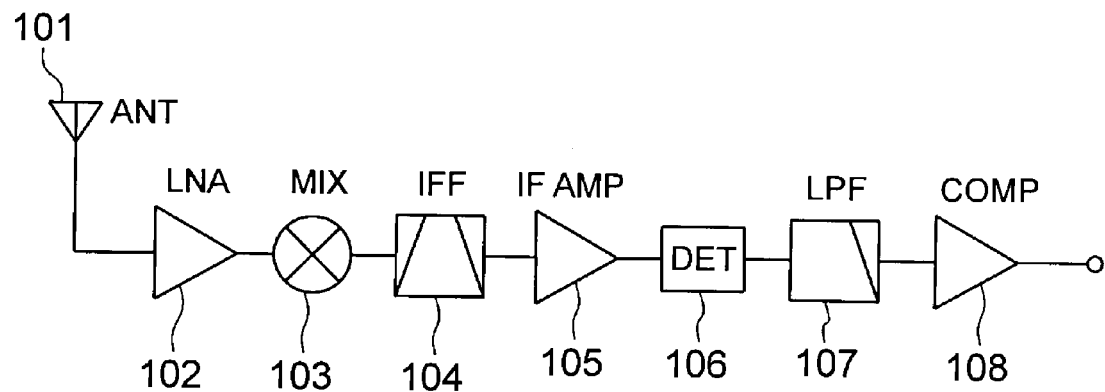
FIG. 1 is a block diagram showing the configuration of an FSK receiving circuit to which a comparator circuit of a first embodiment can be applied.

According to the second embodiment, even in a case where an input signal voltage Vin1 given by the low-pass filter 107 in the preceding stage shown in FIG. 1 fluctuates and varies, an adjustment is made so that the relationship 2×V1 (or V2)=Vin2 (p-p) holds by changing the level by use of the gain-variable type operational amplifier OP3, thereby it is possible to make fast the rise of the average voltage Vref.

Other elements that are the same as in the above-described first embodiment are identified by the same reference numerals as in the first embodiment, and the descriptions of these elements are omitted.

Subsequently, a comparator circuit not provided with a charge/discharge circuit and the comparator circuit in the above-described second embodiment will be described by making a comparison with reference to graphs showing the characteristics of the comparator circuits.

It is assumed that the comparator circuits work sufficiently even when the power source voltage is as low as 3 V. The average voltage Vref in the input signal voltage Vin is set at 1.0 V, and the charge/discharge start voltage is set at 0.2 V.

Figure 7:
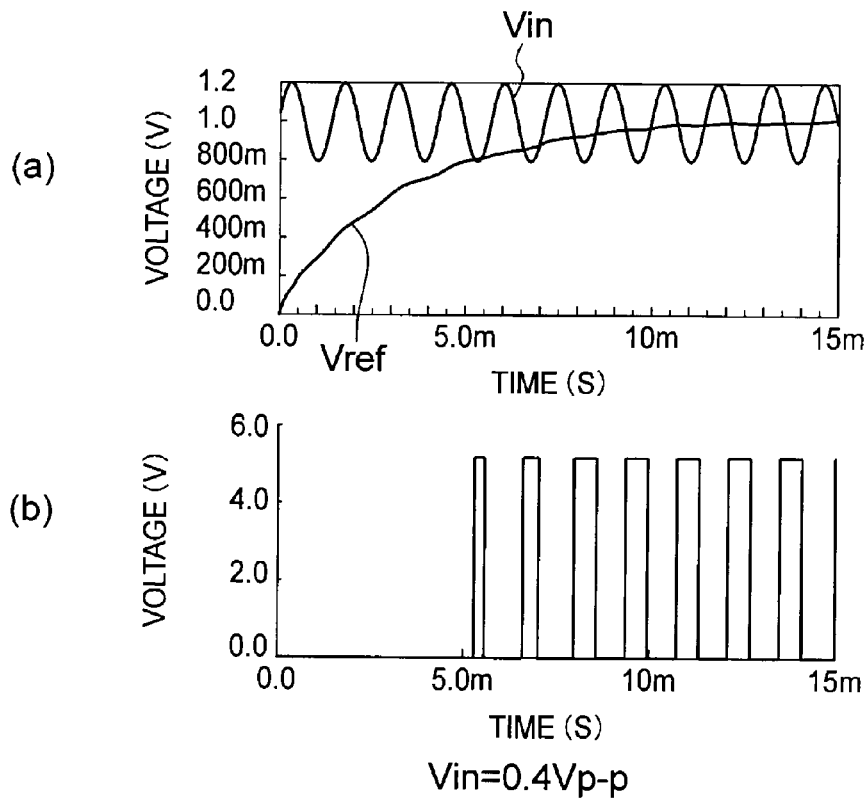
FIGS. 7(a) and 7(b) are graphs showing the input signal voltage Vin=0.4 Vp-p, average voltage, and comparator output voltage in a comparator circuit having no charge/discharge circuit.

The input signal voltage Vin (=0.4 V p-p) and the waveform of the generated average voltage Vref in the comparator circuit not provided with a charge/discharge circuit are shown in FIG. 7(a), and the output voltage waveform from the comparator circuit is shown in FIG. 7(b).

In the comparator circuit not provided with a charge/discharge circuit, the average voltage Vref rises late and as a result of this, it takes time before an output is obtained from the comparator circuit.

Figure 8:
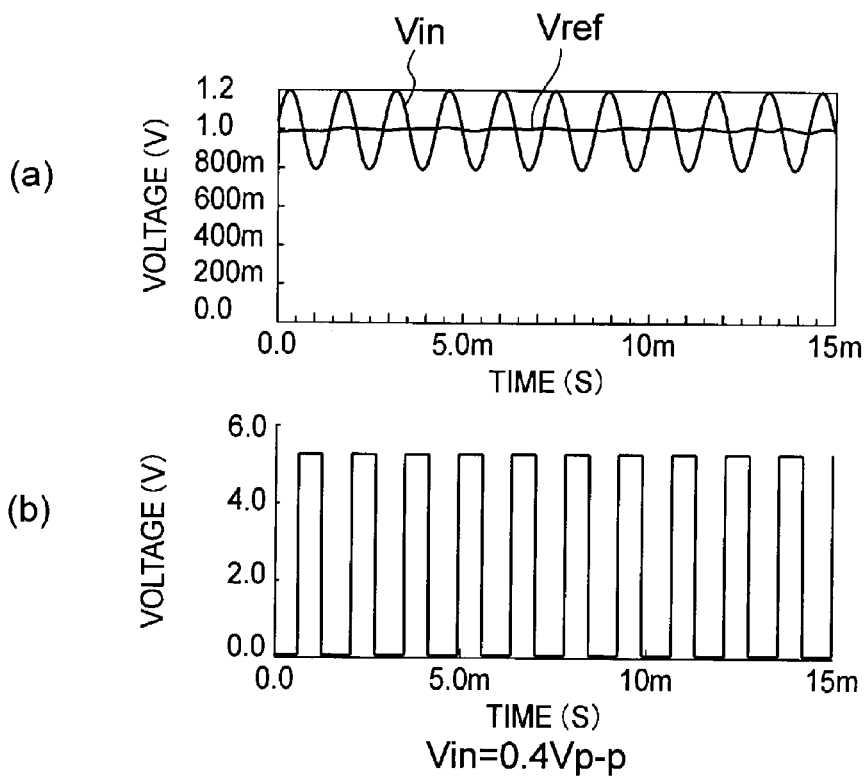
FIGS. 8(a) and 8(b) are graphs showing the input signal voltage Vin=0.4 Vp-p, average voltage, and comparator output voltage in the comparator according to the second embodiment.

The input signal voltage Vin (=0.4 V p-p) and the waveform of the generated average voltage Vref in the comparator circuit in the second embodiment are shown in FIG. 8(a), and the output voltage waveform from the comparator circuit is shown in FIG. 8(b).

In this case, the average voltage Vref rises fast and a duty ratio of 50% is reached in a short time.

Figure 9:
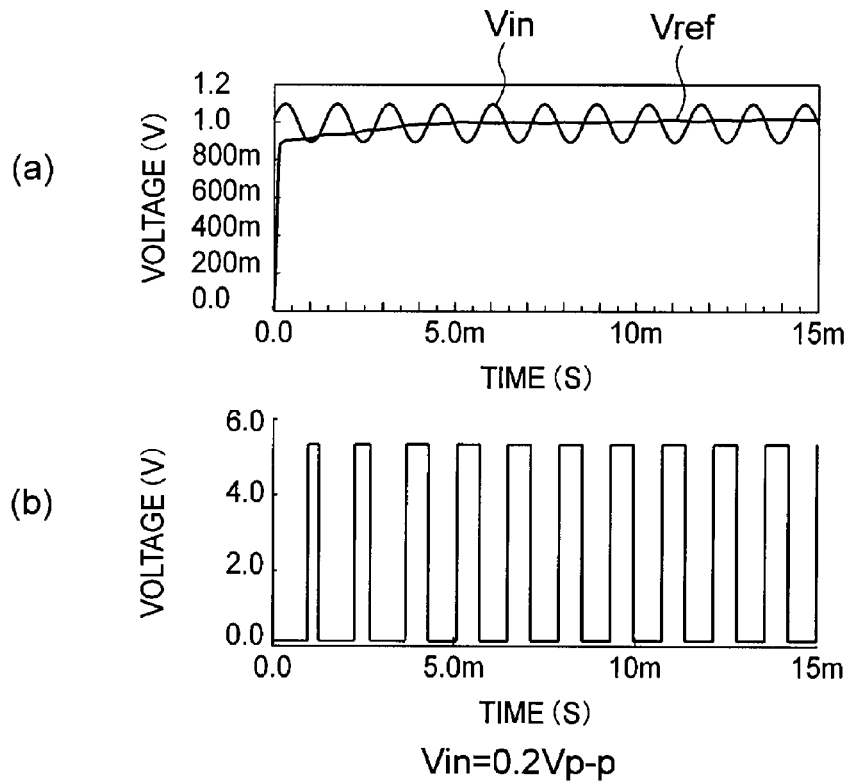
FIGS. 9(a) and 9(b) are graphs showing the input signal voltage Vin=0.2 Vp-p, average voltage, and comparator output voltage in the comparator according to the second embodiment.

In the comparator circuit of the second embodiment, the waveform of the average voltage Vref in a case where the input signal voltage Vin is 0.2 V p-p is shown in FIG. 9(a), and the output voltage waveform from the comparator circuit is shown in FIG. 9(b).

In this case, although the average voltage Vref rises fast, a longer time is required until the duty ratio reaches 50% then in the case where the input signal voltage Vin is 0.4 V p-p.

Figure 10:
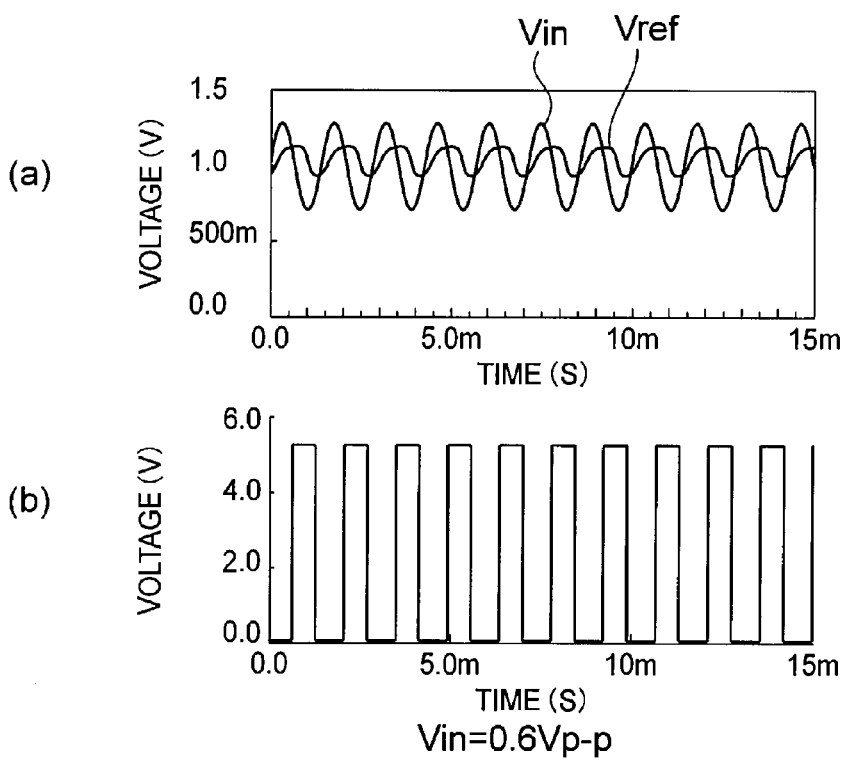
FIGS. 10(a) and 10(b) are graphs showing the input signal voltage Vin=0.6 Vp-p, average voltage, and comparator output voltage in the comparator according to the second embodiment.

Furthermore, in the comparator circuit of the second embodiment, the waveform of the average voltage Vref in a case where the input signal voltage Vin is 0.6 V p-p is shown in FIG. 10(a), and the output voltage waveform from the comparator circuit is shown in FIG. 10(b).

In this case, the relationship Vin−Vref (=0.6 V p-p)>2×V (=0.2 V) holds. Although the rise of the average voltage Vref is fast and the output waveform rises in a short time, the average voltage Vref is not composed of DC components alone and includes AC components and the level varies. Therefore, this lowers the sensitivity regarding the output characteristics from the comparator circuit.

As described above, the relationship between the input signal voltage Vin and the charge/discharge start voltages V1, V2 is important, and it is preferred that the relationship 2×V1 (or V2)=Vin (p-p) hold as far as possible.

According to the second embodiment, it is possible to set the charge/discharge start voltages V1, V2 at any value, and therefore it is possible to perform charging/discharging at a high speed even when the amplitude of the input signal voltage Vin is reduced due to low power-supply voltages.

Third Embodiment

Figure 11:
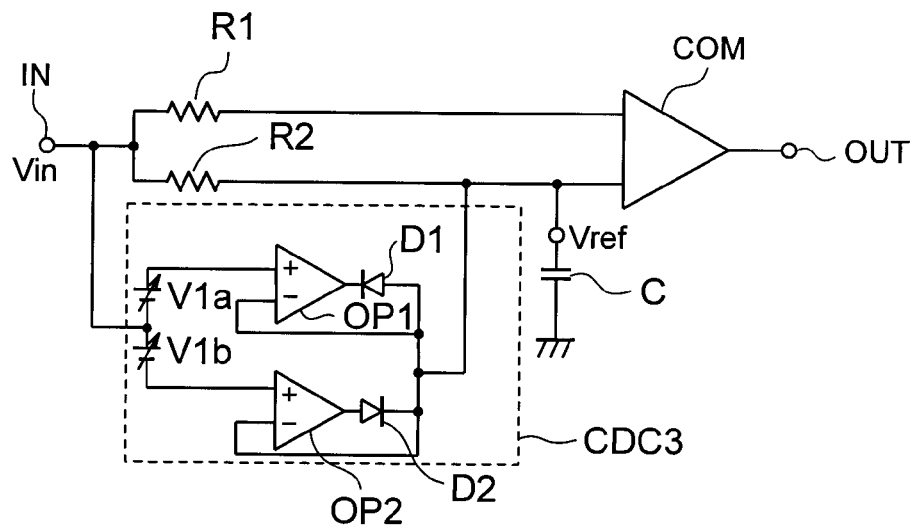
FIG. 11 is a block diagram showing the configuration of a comparator according to a third embodiment.

The configuration of a comparator according to the third embodiment is shown in FIG. 11. In the above-described second embodiment, the level of the input signal voltage Vin is made variable, thereby an adjustment is made so that the relationship 2×V1 (or V2)=Vin2 (p-p) holds.

In contrast to this, in the third embodiment, the charge/discharge start voltage is made variable in the stage when the charge/discharge start voltage is input to the operational amplifiers OP1, OP2 in a charge/discharge circuit CDC3, thereby voltages V1a, V1b are adjusted as variable voltages so that the relationship 2×V1a (or V1b)=Vin2 (p-p) holds.

Other elements that are the same as in the above-described first embodiment are identified by the same reference numerals as in the first embodiment, and the descriptions of these elements are omitted.

Fourth Embodiment

Figure 12:
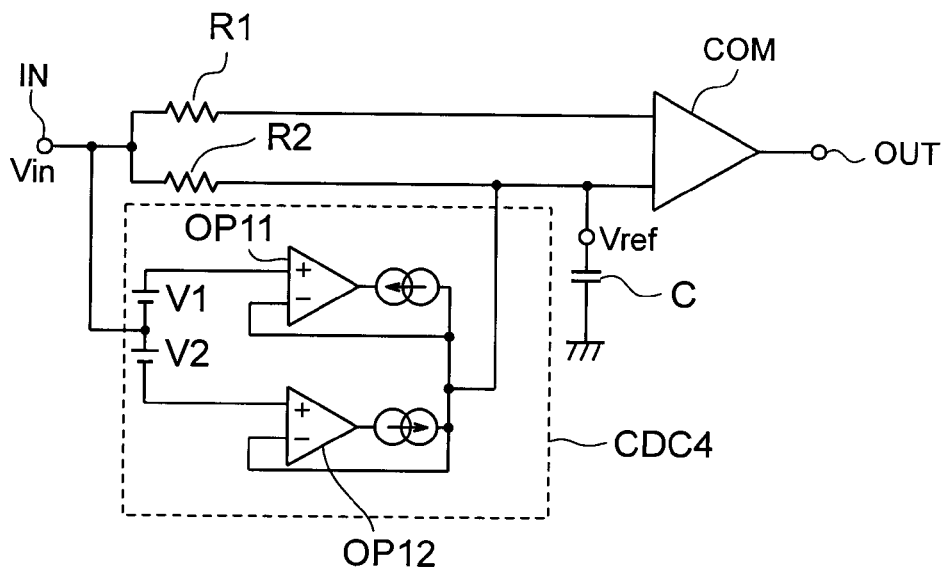
FIG. 12 is a block diagram showing the configuration of a comparator according to a fourth embodiment.

FIG. 12 shows the configuration of a comparator according to the fourth embodiment.

In all of the first to third embodiments of the present invention, the operational amplifiers OP1, OP2 are used, and it is necessary to set the direction of charging or discharging by connecting the diodes D1, D2 to the output terminal.

For this reason, the output voltage drops due to the presence of the diodes D1, D2 by the same amount as the forward voltage VF, and the dynamic range of charge/discharge operation becomes narrow. For example, if the power-supply voltage VCC is 3 V and the forward voltage VF is 0.6 V, operations are performed in the range of 0.6 V to 2.4 V.

On the other hand, in the fourth embodiment, current output amplifiers OP11, OP12 are used. Because no diode is connected to the output terminals of the current output amplifiers OP11, OP12, the dynamic range does not become narrow and in the above-described example operations can be performed in the range of 0 V to 3 V.

In FIG. 12, current sources are shown at the output terminals of the current output amplifiers OP11, OP12. However, the current sources are not actually connected; they schematically show that the current output amplifiers OP11, OP12 are the current output type.

In the first to third embodiments, the diodes D1, D2 are used, and therefore the dynamic range becomes narrow. Unlike the above comparative example, however, the use of the diodes D1, D2 has no effect on the charge/discharge start voltages V1, V2, and the temperature characteristics of the diodes do not exert an influence on the charge/discharge start voltages V1, V2, either.

In the fourth embodiment, other elements that are the same as in the first embodiment are identified by the same reference numerals as in the first embodiment, and the descriptions of these elements are omitted.

Figure 13:
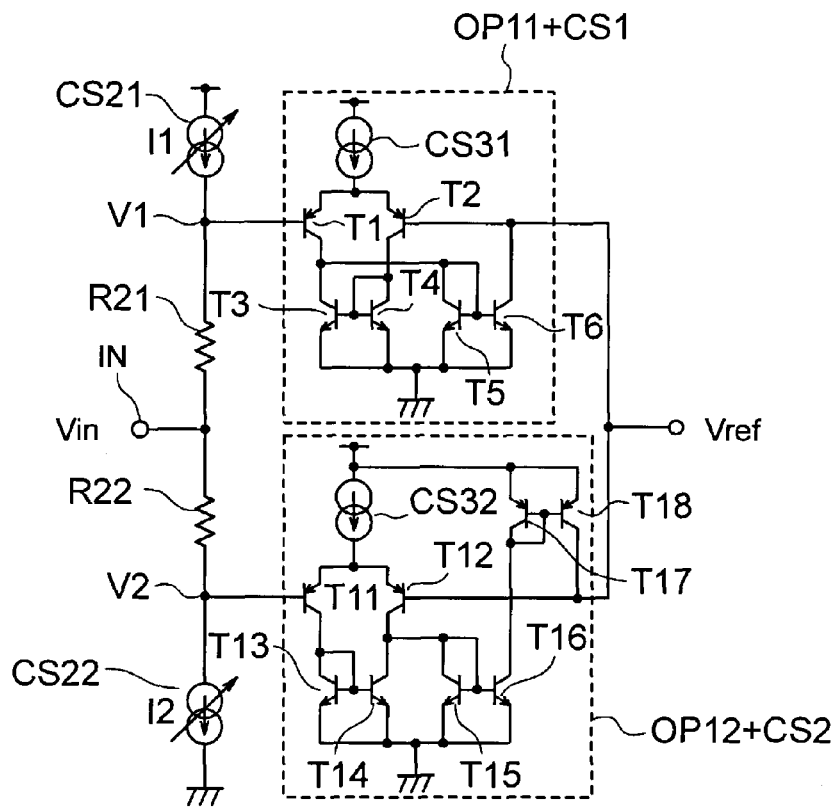
FIG. 13 is a circuit diagram showing the configuration of a current output amplifier in the comparator shown in FIG. 12.

FIG. 13 shows a detailed circuit configuration of a charge/discharge circuit CDC4 in the fourth embodiment.

A current source 11 and a resistor R21 are connected between a power-supply terminal and an input terminal IN, and a voltage V1 is generated at the connection point. A current source 12 and a resistor 22 are connected between the input terminal IN and a ground terminal, and a voltage V2 is generated at the connection point.

The current output amplifier OP11 includes PNP type bipolar transistors T1 and T2, and NPN type bipolar transistors T3 to T6. A voltage V1 is input to the current output amplifier OP11. The current output amplifier OP12 includes PNP type bipolar transistors T11, T12, T17, and T18, and NPN type bipolar transistors T13 to T16. A voltage V2 is input to the current output amplifier OP12. Output terminals of the current output amplifier OP11 and the current output amplifier OP12 are connected to a second input terminal of a comparator COM.

FIG. 13 shows a first current mirror including T1 and T2, a second current mirror including T3 and T4, and a third current mirror including T5 and T6, which are included in the current output amplifier OP11. Further, FIG. 13 shows a first current mirror including T11 and T12, a second current mirror including T13 and T14, and a third current mirror including T15 and T16, which are included in the current output amplifier OP12. Bases, emitters, and collectors of the transistors T1 to T16 are shown in FIG. 13, and are connected each other or to other elements as shown in FIG. 13.

For the voltage V1, the relationship V1=I1×R21 holds between a current I1 flowing through a current source CS21 and a resistance value R21 of the resistor R21. For a voltage V2, the relationship V2=I2×R22 holds between a current I2 flowing through a current source CS22 and a resistance value R22 of the resistor R22. Therefore, by providing the current sources CS21, CS22 as variable current sources and changing the currents I1, I2, it is possible to set the charge/discharge start voltage of the current output amplifiers OP11, OP12 at a desired value.

Figure 14:
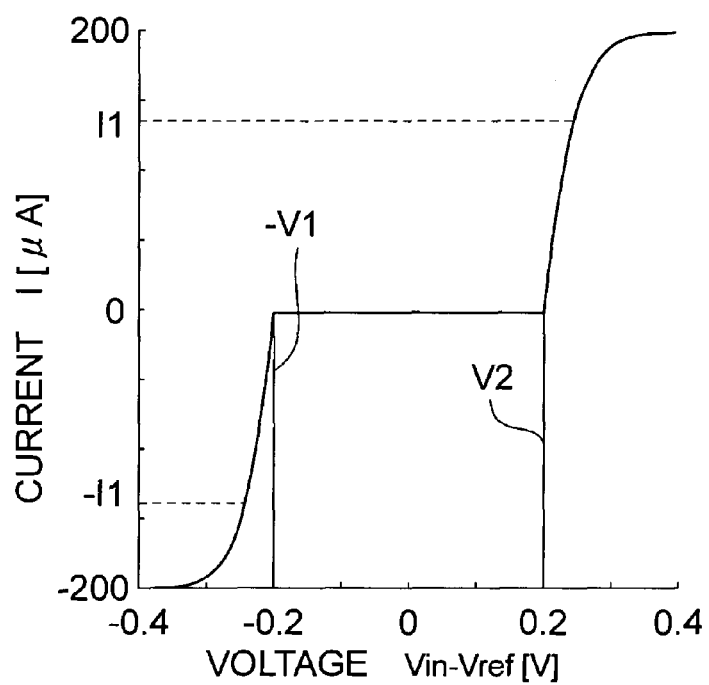
FIG. 14 is a graph showing the charge/discharge start voltage in the comparator shown in FIG. 12.

FIG. 14 shows the voltage-current characteristics between the input signal voltage Vin—average voltage Vref and the charge/discharge current I in a comparator according to the fourth embodiment.

The capacitor C is charged when the voltage Vi−Vref exceeds V2, and the capacitor C is discharged when the voltage Vi−Vref becomes lower than −V1. In FIG. 14, the current necessary for charging/discharging is ±I1, and it is preferred that the current be set so that operations are performed within a range in which the relationship between the voltage Vi−Vref and the current I is linear. As a result of this, unlike in a range in which the relationship between the voltage Vi−Vref and the current I is not linear, a high response speed is obtained.

The comparator circuits in the above-described first to fourth embodiments can also be used as an FSK receiving circuit by being applied to the comparator circuit 108 shown in FIG. 1.

For example, an FSK receiving circuit of an aspect of the present invention includes: an antenna configured to receive a signal; a low-noise amplifier configured to amplify the signal received by the antenna; a mixer configured to reduce the frequency of a signal output from the low-noise amplifier; an intermediate frequency filter configured to remove components except an intermediate frequency from a signal output from the mixer; an intermediate frequency amplifier configured to amplify a signal output from the intermediate frequency filter; a detector configured to detect a signal output from the intermediate frequency amplifier, a low-pass filter configured to cause low-frequency components of a signal detected by the detector to pass; and a comparator circuit configured to output a result of a comparison between the voltage of a signal output from the low-pass filter and the average voltage of this signal. In this FSK receiving circuit, the comparator circuit includes: a comparator configured to compare an input signal voltage with a reference voltage obtained by smoothing the input signal voltage by use of a resistor and a capacitor, and output a result of the comparison; a discharge circuit configured to compare a first addition signal which is obtained by adding a first voltage to the input signal voltage, with the reference voltage, and discharge the capacitor when the first addition signal is lower than the reference signal; and a charge circuit configured to compare a second addition signal which is obtained by adding a second voltage to the input signal voltage, with the reference voltage, and charge the capacitor when the second addition signal is higher than the reference voltage.

Fifth Embodiment

Figure 15:
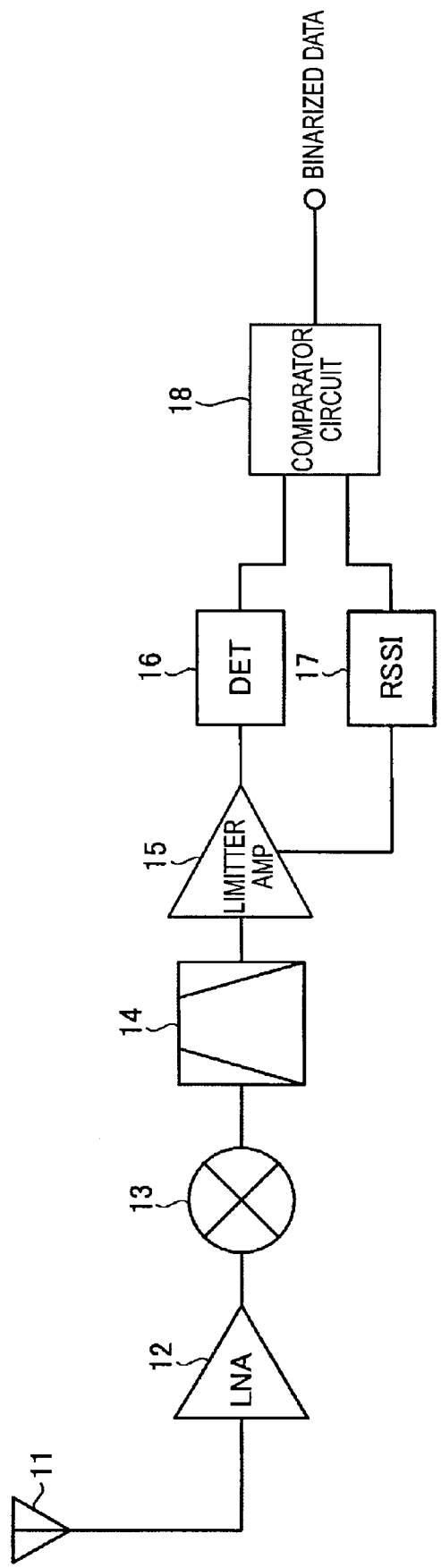
FIG. 15 is a block diagram showing a schematic configuration of a receiving circuit to which a charge/discharge circuit of a fifth embodiment is applied.

FIG. 15 is a block diagram showing a schematic configuration of a receiving circuit to which a charge/discharge circuit of a fifth embodiment is applied.

In FIG. 15, the receiving circuit is provided with an antenna 11 that receives a radio wave, a low-noise amplifier 12 that amplifies a signal received by the antenna 11, a mixer 13 that downconverts the carrier frequency of the received signal amplified by the low-noise amplifier 12 to an intermediate frequency, an intermediate frequency filter 14 that removes unnecessary band components from the intermediate frequency signal downconverted by the mixer 13, a limiter amplifier 15 that amplifies the intermediate frequency signal passing through the intermediate frequency filter 14, an FM detector 16 that FM-demodulates an FSK signal amplified by the limiter amplifier 15, an RSSI detector 17 that AM-demodulates an ASK signal amplified by the limiter amplifier 15, and a comparator circuit (binarization circuit) 18 that binarizes the FSK signal and ASK signal demodulated by the FM detector 16 and the RSSI detector 17 respectively.

When an FSK signal is received by the antenna 11, the FSK signal is amplified by the low-noise amplifier 12, downconverted by the mixer 13 to an intermediate frequency, and input to the intermediate frequency filter 14. Subsequently, unnecessary band components of the FSK signal is removed by the intermediate frequency filter 14, and then the FSK signal is amplified by the limiter amplifier 15, FM-demodulated by the FM detector 16, and input to the comparator circuit 18. In the comparator circuit 18, the FSK signal output from the FM detector 16 is smoothed to generate a reference voltage Vref of the FSK signal. Further, the FSK signal is binarized by comparing this reference voltage Vref with the FSK signal, and outputted as binarized data.

On the other hand, when an ASK signal is received by the antenna 11, the ASK signal is amplified by the low-noise amplifier 12, downconverted by the mixer 13 to an intermediate frequency, and input to the intermediate frequency filter 14. Subsequently, unnecessary band components of the ASK signal is removed by the intermediate frequency filter 14, and then the ASK signal is amplified by the limiter amplifier 15, AM-demodulated by the RSSI detector 17, and input to the comparator circuit 18. In the comparator circuit 18, the ASK signal output from the RSSI detector 17 is smoothed to generate a reference voltage Vref of the ASK signal. Further, the ASK signal is binarized by comparing this reference voltage Vref with the ASK signal, and is outputted as binarized data.

Figure 16:
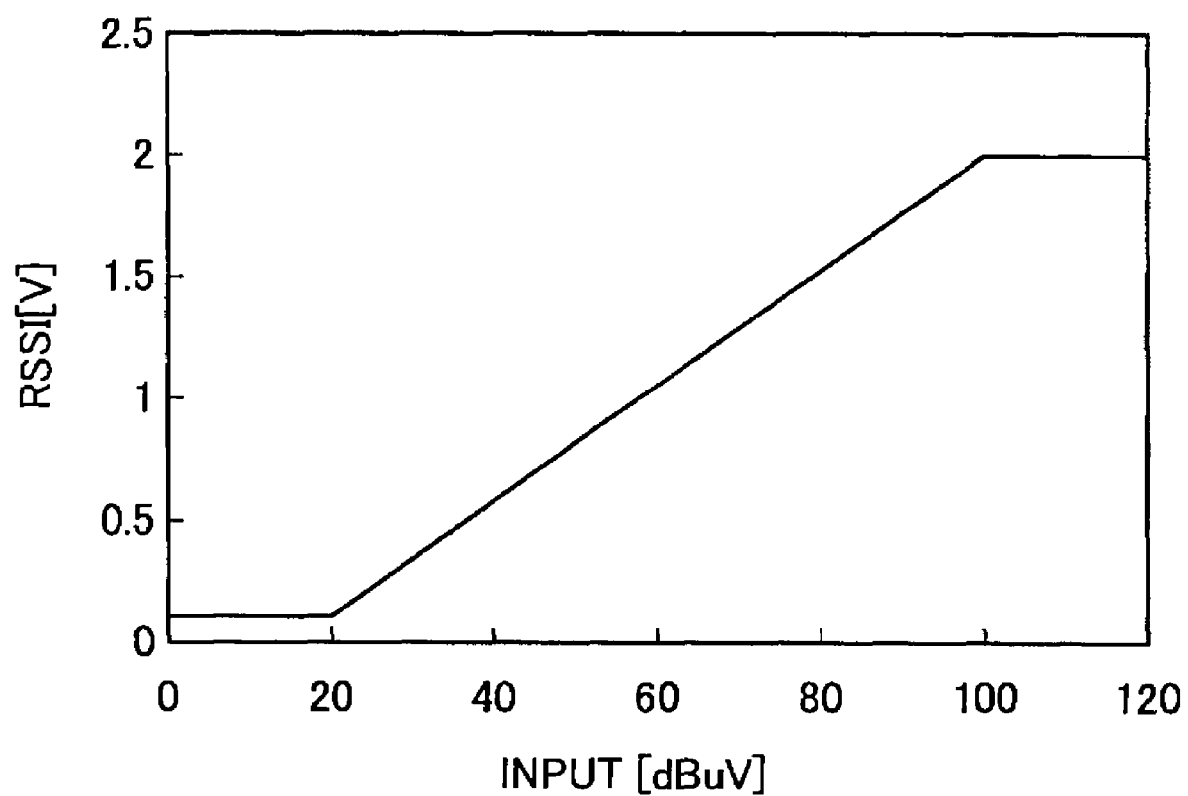
FIG. 16 is a diagram showing the RSSI characteristics of a RSSI detector in FIG. 15.

FIG. 16 is a diagram showing the RSSI characteristics of the RSSI detector in FIG. 15.

As shown in FIG. 16, in the RSSI detector 17, the RSSI level increases with increasing input level. For this reason, the level of a demodulated signal input to the comparator circuit 18 varies depending on the input level of a received signal.

In the comparator circuit 18, it is possible to pass an FSK signal and an ASK signal through a low-pass filter including a resistor and a capacitor, to generate the reference voltage Vref of the FSK signal and the reference voltage Vref of the ASK signal. A capacitor voltage generated when the capacitor is charged/discharged can be used as the reference voltage Vref. In this case, in order to make fast the rise of the reference voltage Vref, the capacitor that generates the reference voltage Vref can be rapidly charged and discharged, and in order to rapidly charge/discharge the capacitor, it is possible to charge/discharge the capacitor while bypassing the resistor constituting the low-pass filter. As a method of charging/discharging the capacitor while bypassing the resistor constituting this low-pass filter, it is possible to use a method that involves connecting a bidirectional diode characteristic circuit to the resistor.

Figure 17:
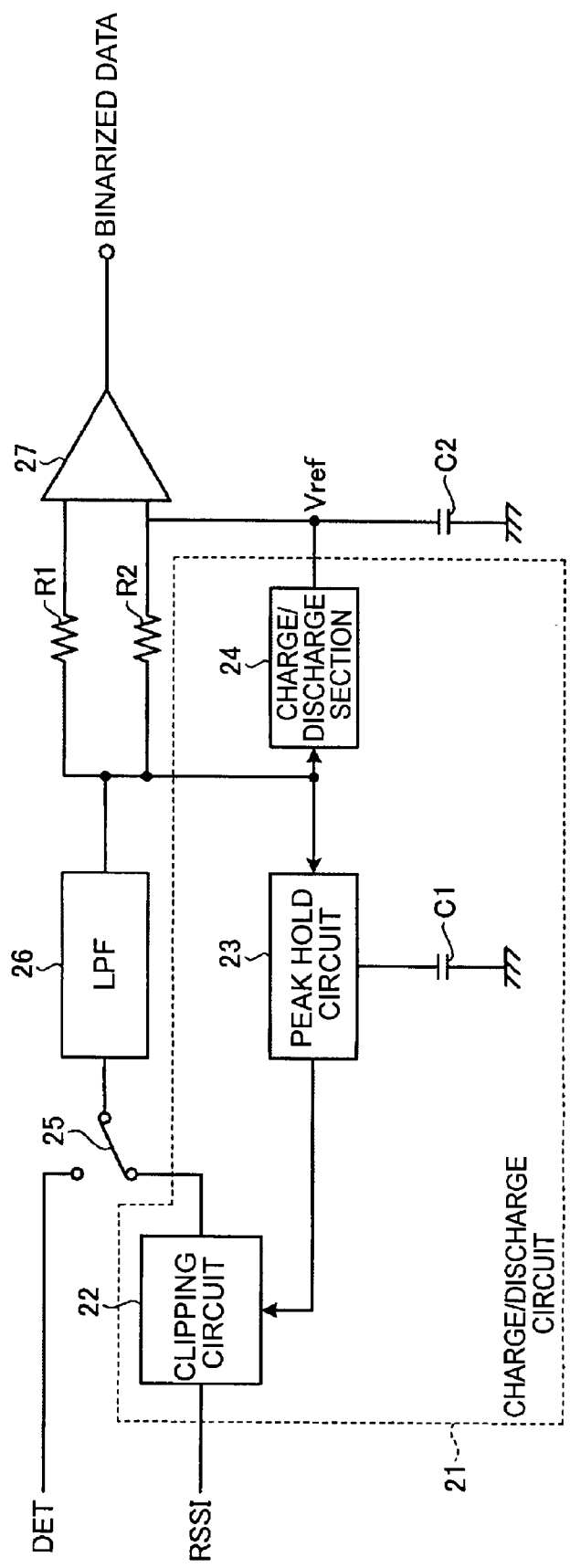
FIG. 17 is a block diagram showing a schematic configuration of a comparator circuit in FIG. 15.

FIG. 17 is a block diagram showing a schematic configuration of the comparator circuit in FIG. 15.

In FIG. 17, the comparator circuit 18 is provided with a comparator 27 that generates binarized date by comparing an input signal with the reference voltage Vref. One input terminal of the comparator 27 is connected to the output side of a low-pass filter 26 via a resistor R1, and the other input terminal of the comparator 27 is connected to the output side of the low-pass filter 26 via a resistor R2 and also to a capacitor C2. The resistor R2 and the capacitor C2 can constitute a smoothing circuit including a low-pass filter, and the capacitor C2 can generate the reference voltage Vref used as a threshold of the comparator 27.

The comparator circuit 18 is also provided with a charge/discharge circuit 21 that rapidly charges and discharges the capacitor C2, and the charge/discharge circuit 21 is provided with a clipping circuit 22, a peak hold circuit 23, and a charge/discharge section 24. The charge/discharge section 24 can charge and discharge the capacitor C2 by bypassing the resistor R2, which constitutes a smoothing circuit with the capacitor C2. The charge/discharge section 24 in FIG. 17 corresponds to the charge/discharge circuit CDC1 in FIG. 2.

The peak hold circuit 23 can detect a peak value of an input signal input to the charge/discharge section 24, and is connected to a capacitor C1 that holds this peak value of the input signal. The clipping circuit 22 can clip a level lower than a given value, from the peak value of the input signal.

One input side of a switch 25 is connected to the output side of the FM detector 16 of FIG. 15, the other input side of the switch 25 is connected to the output side of the RSSI detector 17 of FIG. 15 via the clipping circuit 22, and the output side of the switch 25 is connected to the input side of the low-pass filter 26.

Figure 18:
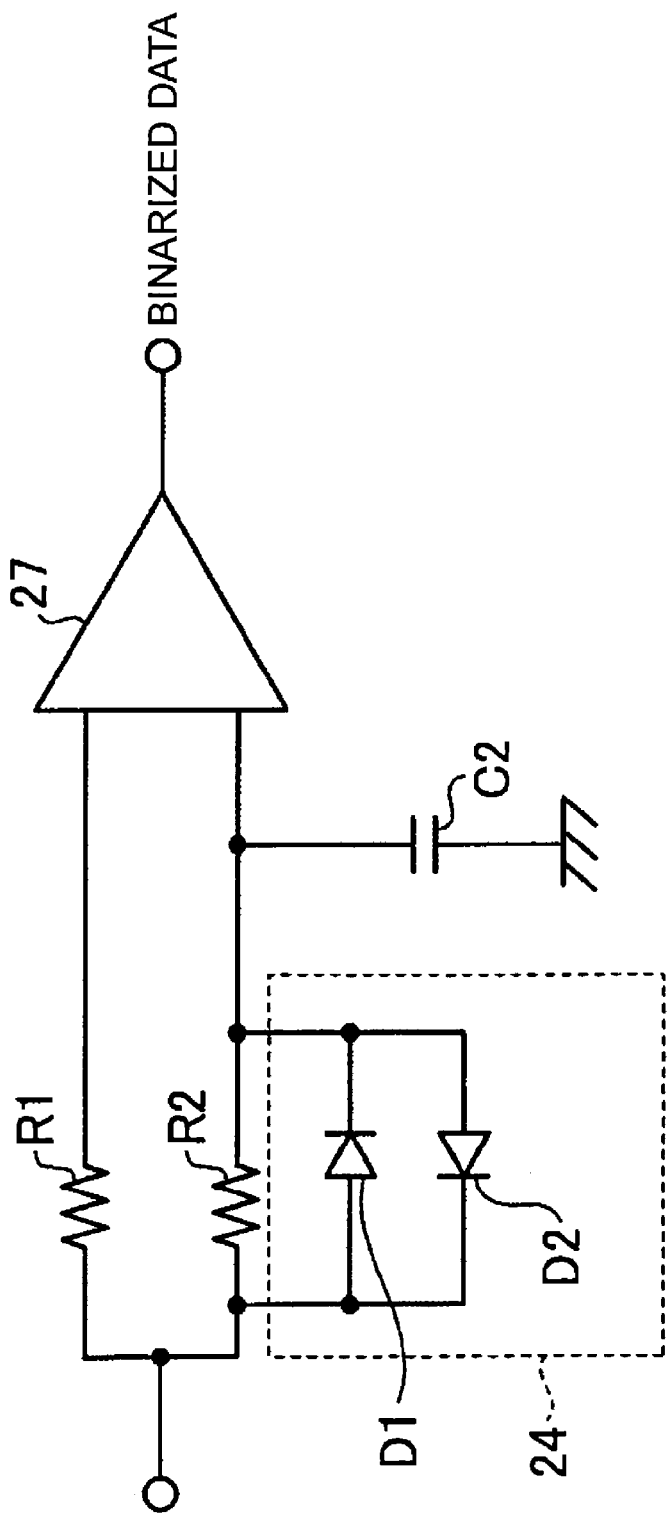
FIG. 18 is a circuit diagram showing a schematic configuration of a charge/discharge section in FIG. 17.

FIG. 18 is a circuit diagram showing a schematic configuration of the charge/discharge section in FIG. 17.

In FIG. 18, the charge/discharge section 24 is provided with diodes D1, D2. The diodes D1, D2 are connected parallel to a resistor R2 so that the directions of the diodes D1, D2 become reversed to each other.

In FIG. 17, when an FSK signal is received by the antenna 11, the switch 25 is changed over to the FM detector 16 side. After the removal of unnecessary high-frequency components by the low-pass filter 26, an FSK signal demodulated by the FM detector 16 is input to one input terminal of the comparator 27 via the resistor R1, and input to the charge/discharge section 24. In the charge/discharge section 24, in a case where the amplitude of the FSK signal is larger than the reference voltage Vref, a current is caused to flow into the capacitor C2 via the diode D1 of FIG. 18, thereby the reference voltage Vref is raised, whereas in a case where the amplitude of the FSK signal is smaller than the reference voltage Vref, a current is caused to flow from the capacitor C2 via the diode D2 of FIG. 18, thereby the reference voltage Vref is lowered. In this manner, a reference voltage Vref which is obtained by smoothing the FSK signal is generated in the capacitor C2.

The reference voltage Vref generated by the capacitor C2 is input to the other input terminal of the comparator 27, and compared with the FSK signal input via the resistor R1, thereby binarized data is generated.

On the other hand, when an ASK signal is received by the antenna 11, the switch 25 is changed to the clipping circuit 22 side. After the removal of unnecessary high-frequency components by the low-pass filter 26, an ASK signal output via the clipping circuit 22 is input to one input terminal of the comparator 27 via the resistor R1 and input to the peak hold circuit 23 and the charge/discharge section 24.

When the ASK signal is input to the peak hold circuit 23, a peak value of the ASK signal is detected and output to the clipping circuit 22. In the clipping circuit 22, a signal lower than the clipping level is clipped from the peak value of the ASK signal, thereby the amplitude of the ASK signal is equalized, and the ASK signal is input to the charge/discharge section 24 via the low-pass filter 26.

In the charge/discharge section 24, in a case where the amplitude of the ASK signal is larger than the reference voltage Vref, a current is caused to flow into the capacitor C2 via the diode D1 of FIG. 18, thereby the reference voltage Vref is raised, whereas in a case where the amplitude of the ASK signal is smaller than the reference voltage Vref, a current is caused to flow from the capacitor C2 via the diode D2 of FIG. 18, thereby the reference voltage Vref is lowered. In this manner, a reference voltage Vref which is obtained by smoothing the ASK signal is generated in the capacitor C2.

The reference voltage Vref generated in the capacitor C2 is input to the other input terminal of the comparator 27 and compared with the ASK signal input via the resistor R1, thereby binarized data is generated.

By equalizing the amplitude of the ASK signal in the clipping circuit 22, it is possible to keep constant the amplitude of an input signal which is to be compared with the reference voltage Vref, even in demodulating the ASK signal using the RSSI. For this reason, even when the charging/discharging of the capacitor C2 is performed via the charge/discharge section 24, it is possible to keep the average voltage Vref stable, and even in demodulating the ASK signal using the RSSI, the rise of the average voltage Vref can be made fast, and therefore it is possible to reduce the consumption of a battery in a system that operates on the battery.

Figures 1, 19:
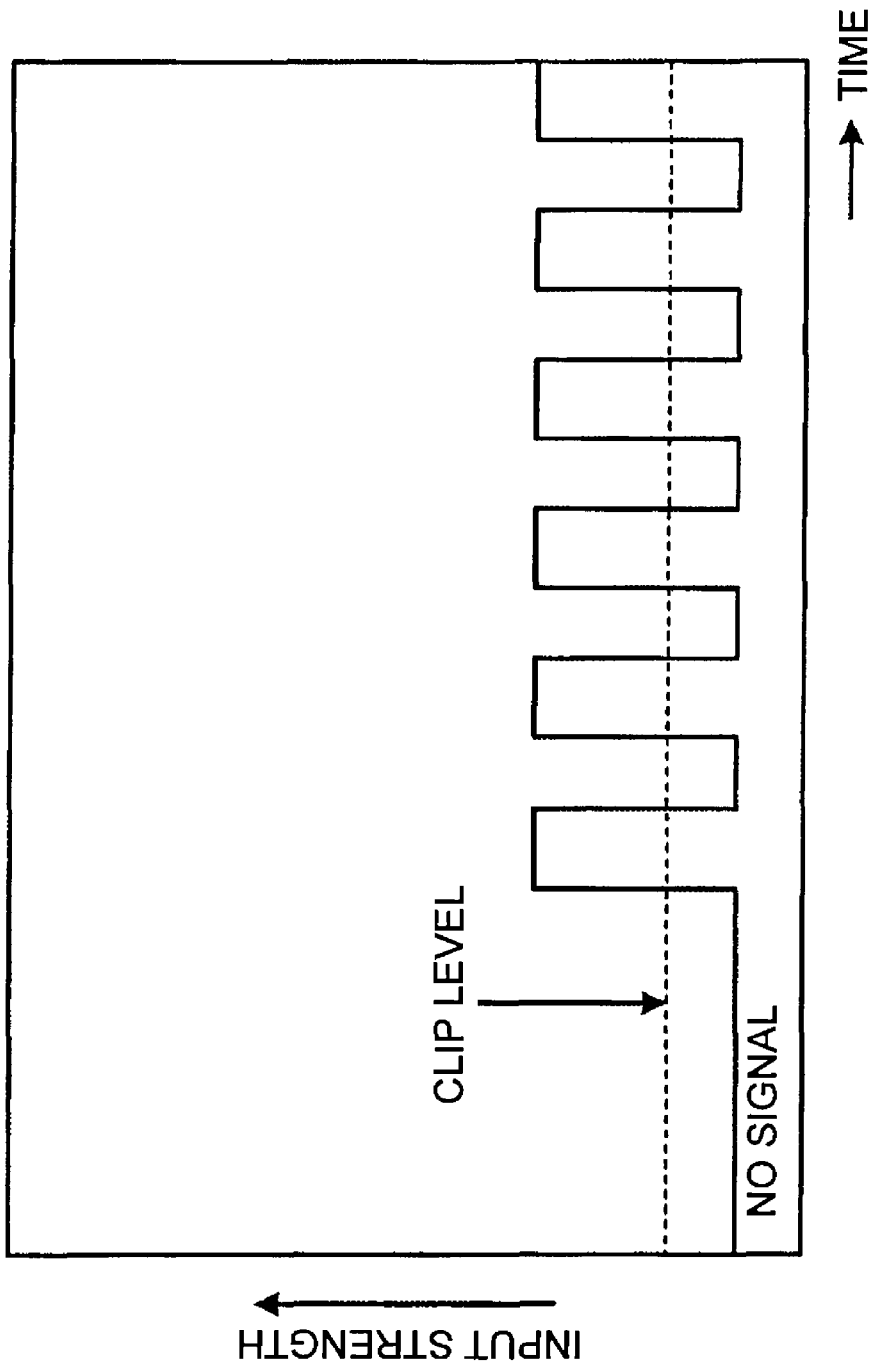
Figures 2, 19:
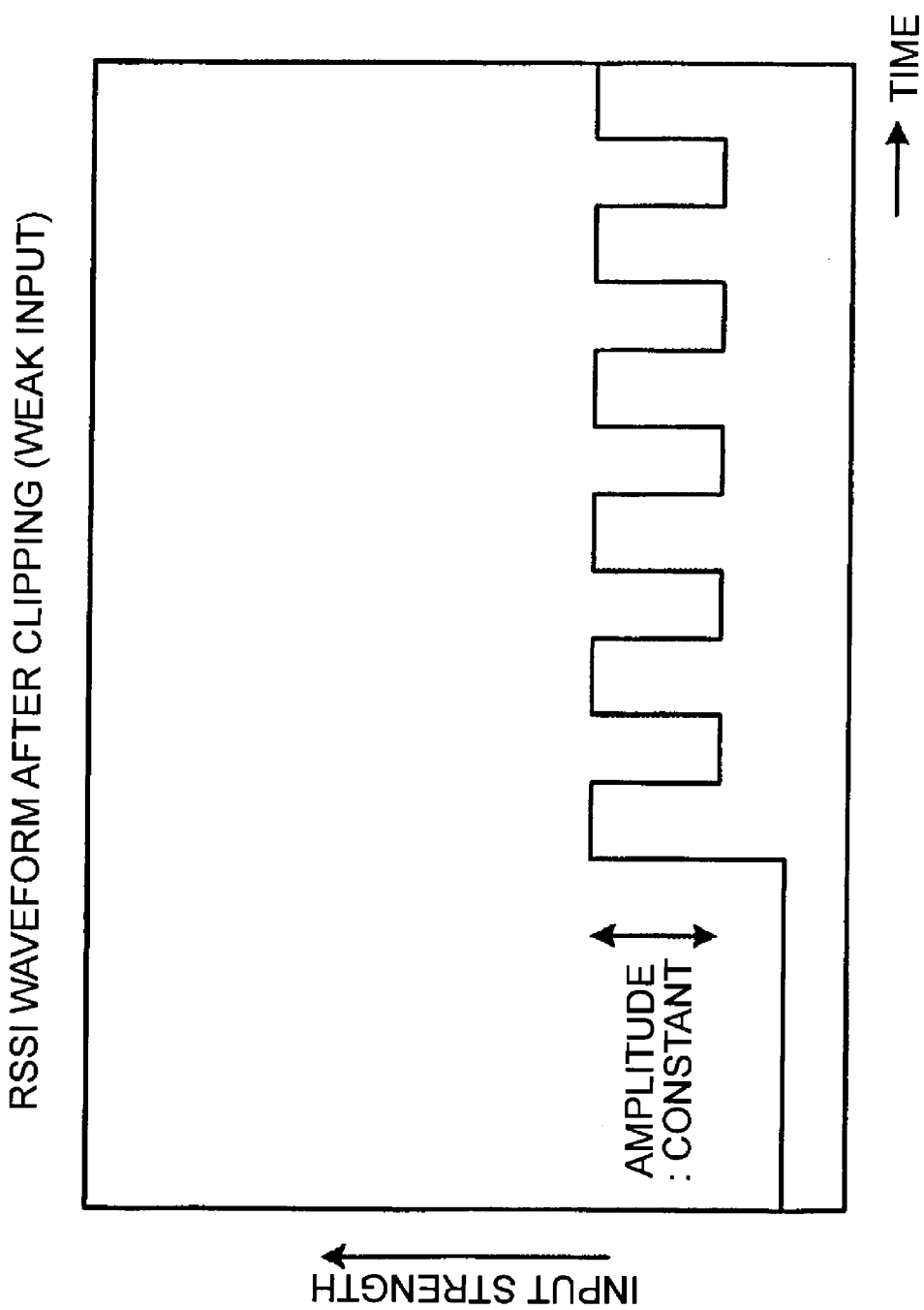
Figures 1, 20:
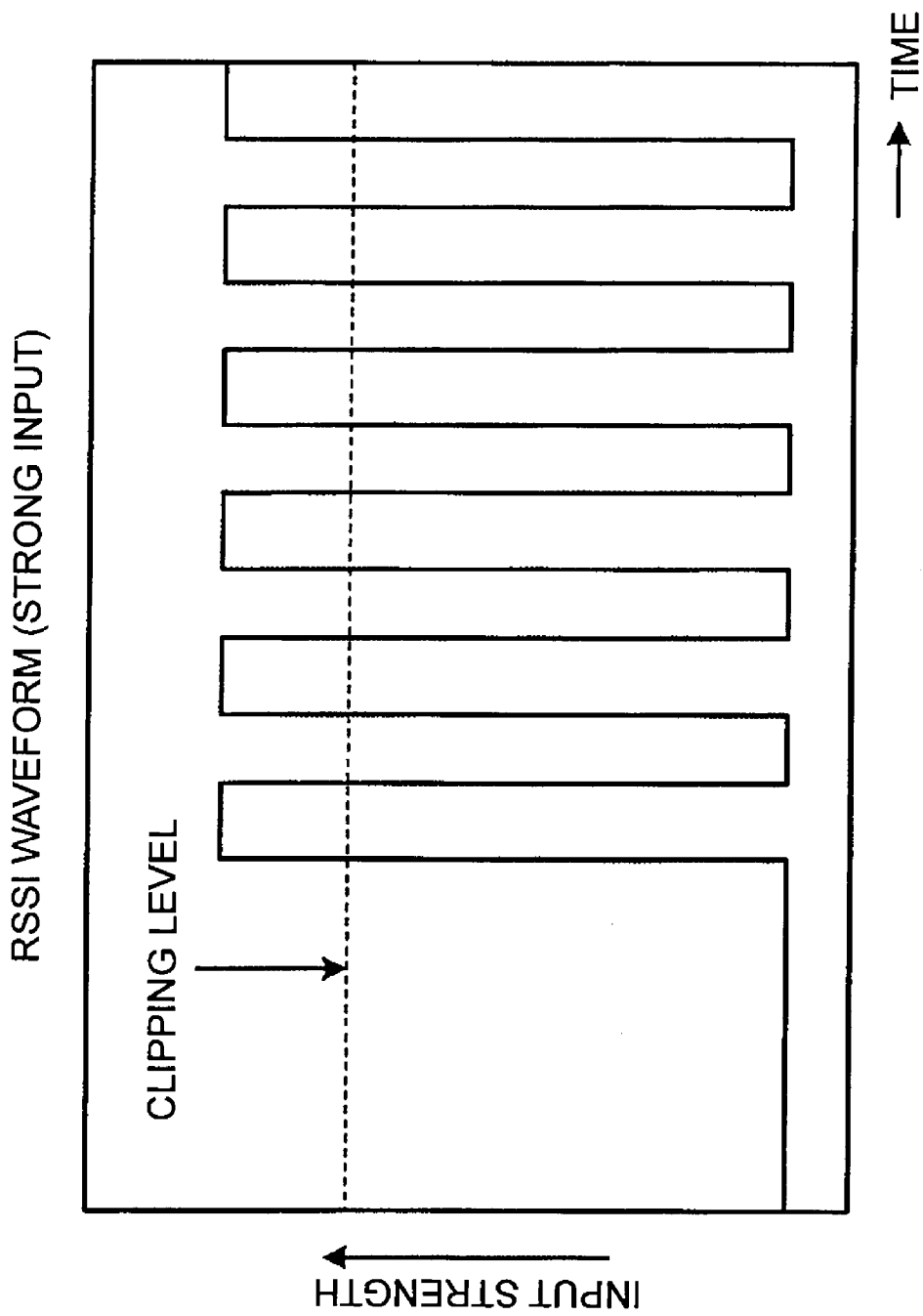
Figures 2, 20:
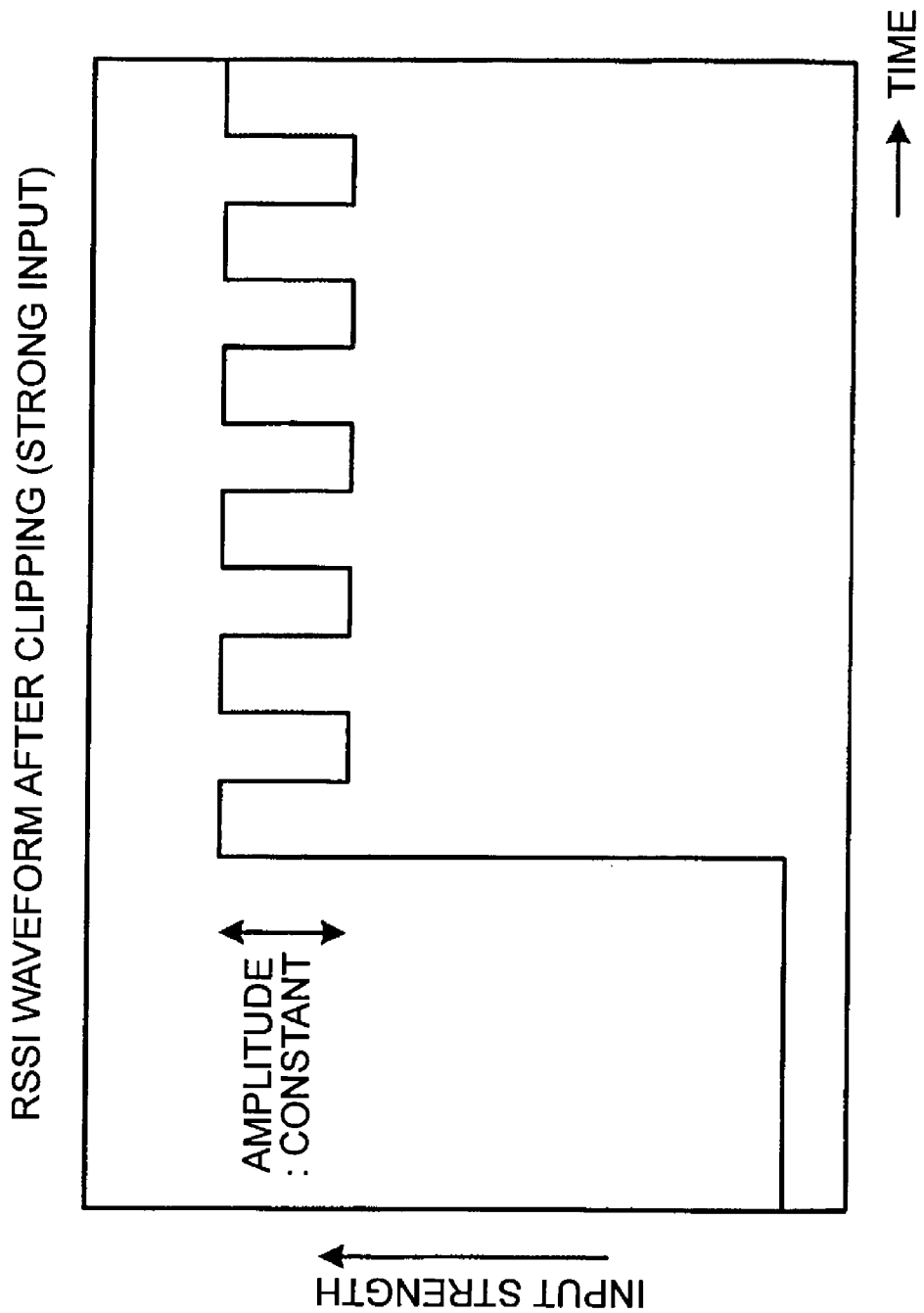

FIG. 19-1 is a diagram showing the RSSI waveform during a weak input before clipping in the charge/discharge circuit of FIG. 15. FIG. 19-2 is a diagram showing the RSSI waveform during a weak input after clipping in the charge/discharge circuit of FIG. 15. FIG. 20-1 is a diagram showing the RSSI waveform during a strong input before clipping in the charge/discharge circuit of FIG. 15. FIG. 20-2 is a diagram showing the RSSI waveform during a strong input after clipping in the charge/discharge circuit of FIG. 15.

In FIGS. 19-1 and 20-1, the amplitude of an ASK signal demodulated by using RSSI changes depending on the level of a received signal. By setting the clipping level of the clipping circuit 22 so that levels lower than a given value are clipped from the peak value of the ASK signal as shown in FIGS. 19-2 and 20-2, even in demodulating the ASK signal using the RSSI, it is possible to keep constant the amplitude of an input signal input to the charge/discharge section 24, and it is possible to rapidly charge and discharge the capacitor C2 via the charge/discharge section 24.

By clipping levels lower than a given value from the peak value of the ASK signal, the bit information of a base band (0, 1) is caused to correspond to the binary amplitude of a carrier wave (Levels L and H), which is OOK (on off keying). Even when Level L comes to a no-signal condition, it is possible to remove noise that is generated in a no-signal condition, and noise resistance can be improved. The clipping circuit 22 may configured to clip a level equal to a given value, from the peak value of the input signal, or may be configured not to clip a level equal to a given value, from the peak value of the input signal.

Sixth Embodiment

Figures 1, 21:
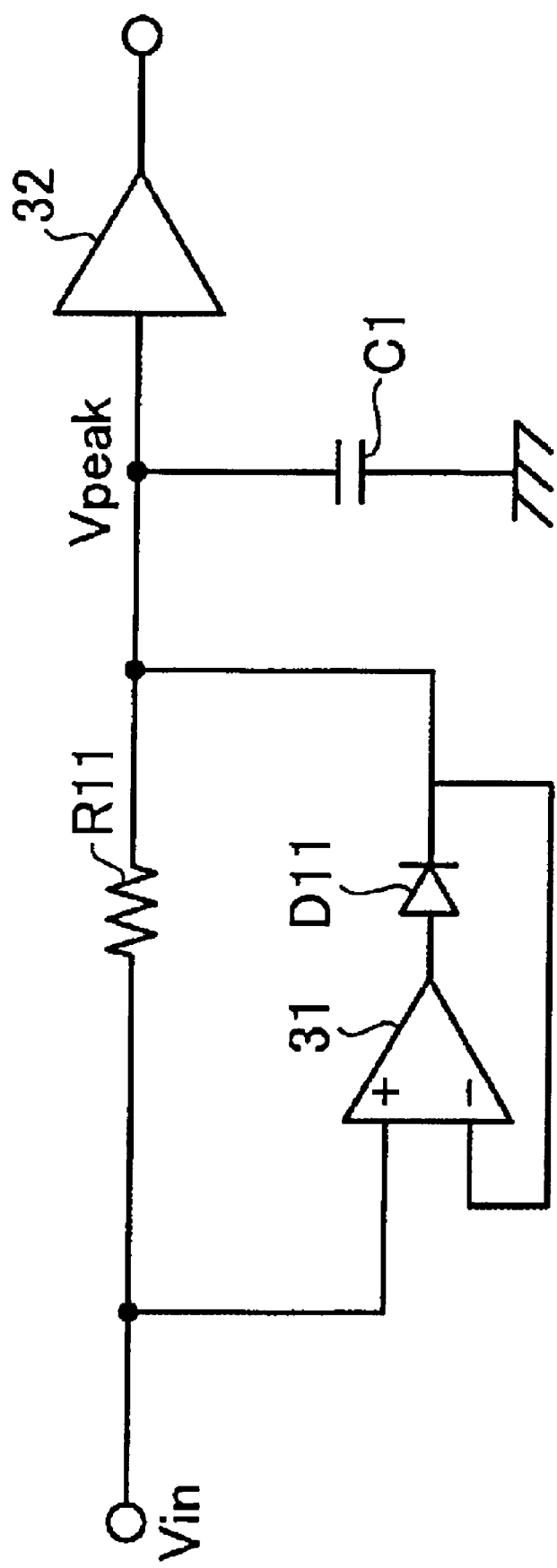
Figures 2, 21:
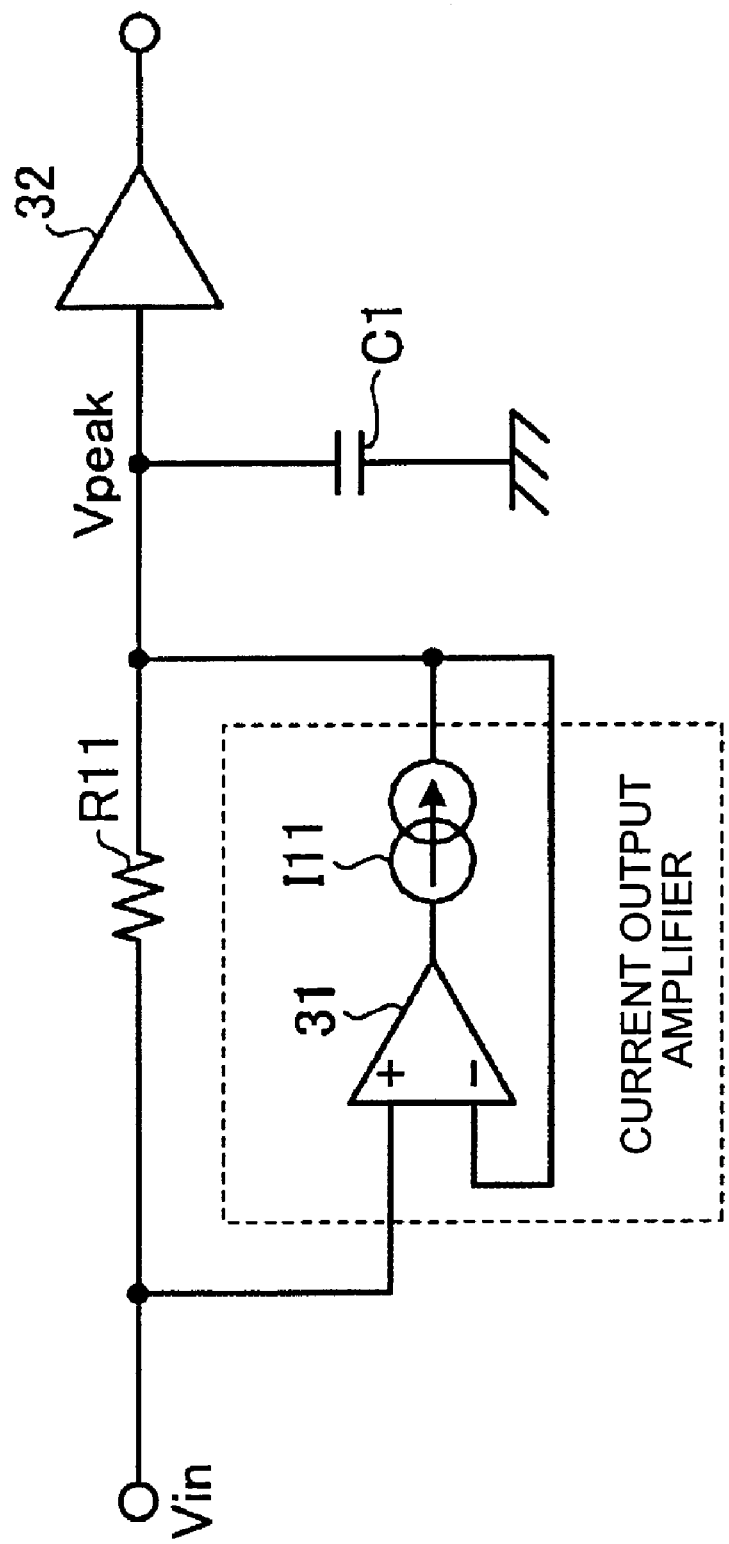

FIG. 21-1 is a circuit diagram showing a schematic configuration of a peak hold circuit which is applied to a charge/discharge circuit of a sixth embodiment.

In FIG. 21-1, an output terminal of an operational amplifier 31 is connected to a non-inverting input terminal of the operational amplifier 31 via a diode D11 and a resistor R11 in sequence and connected to an inverting input terminal of the operational amplifier 31 via the diode D11. A cathode terminal of the diode D11 is connected to a capacitor C1 and a buffer 32 respectively.

When the input voltage Vin is input to the non-inverting input terminal of the operational amplifier 31, the input voltage Vin is compared with the capacitor voltage Vpeak of the capacitor C1. When the input voltage Vin is larger than the capacitor voltage Vpeak, a voltage is applied to the capacitor C1 via the diode D11, and the capacitor C1 is charged until the capacitor voltage Vpeak becomes equal to a peak value of the input voltage Vin, thereby the peak value of the input voltage Vin is held in the capacitor C1.

Seventh Embodiment

FIG. 21-2 is a circuit diagram showing a schematic configuration of a peak hold circuit which is applied to a charge/discharge circuit of a seventh embodiment.

In the peak hold circuit diagram of FIG. 21-2, a current supply circuit I11 is provided in place of the diode D11 of FIG. 21-1. When the input voltage Vin is larger than the capacitor voltage Vpeak, a current is supplied to the capacitor C1 via the current supply circuit I11 and the capacitor C1 is charged until the capacitor voltage Vpeak becomes equal to a peak value of the input voltage Vin, thereby the peak value of the input voltage Vin is held in the capacitor C1.

Eighth Embodiment

Figure 22:
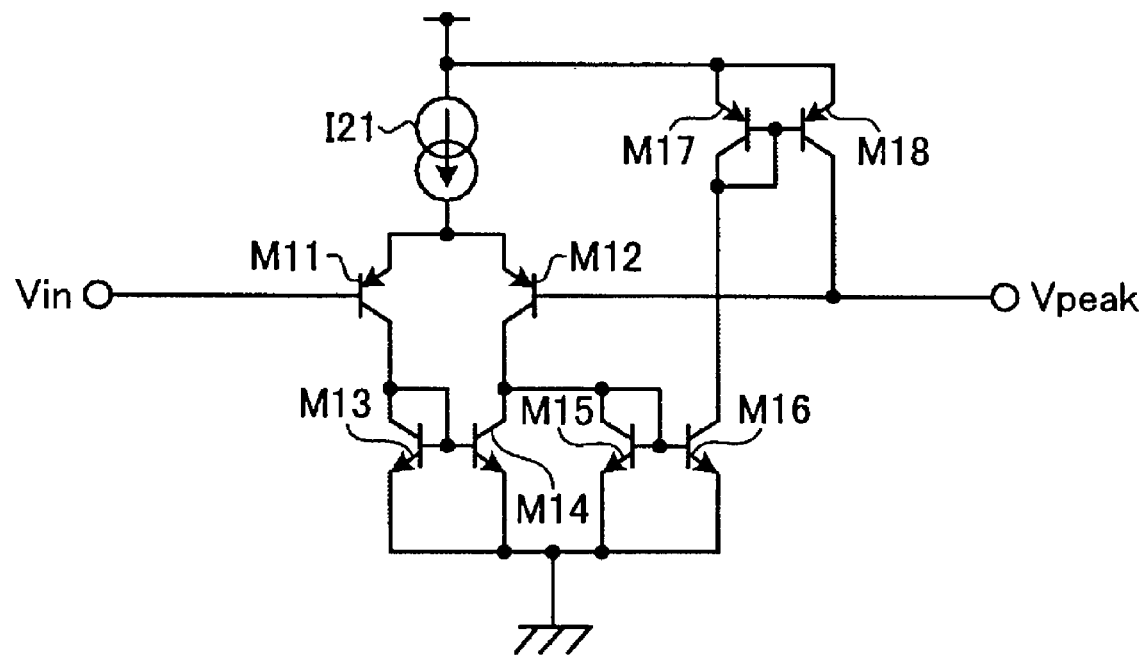
FIG. 22 is a circuit diagram showing a schematic configuration of a peak hold circuit which is applied to a charge/discharge circuit of an eighth embodiment.

FIG. 22 is a circuit diagram showing a schematic configuration of a peak hold circuit which is applied to a charge/discharge circuit of an eighth embodiment.

In FIG. 22, bipolar transistors M11, M12 constitute a differential amplifier, and a current source I21 is connected to collectors of the bipolar transistors M11, M12 as a common current source. Bipolar transistors M13, M14 constitute a current mirror for a current flowing through the bipolar transistor M11, bipolar transistors M15, M16 constitute a current mirror for a current flowing through the bipolar transistor M12, and bipolar transistors M17, M18 constitute a current mirror for a current flowing through the bipolar transistor M16.

Incidentally, the PNP type can be used for the bipolar transistors M11, M12, M17, M18, and the NPN type can be used for the bipolar transistors M13, M14, M15, M16.

When the input voltage Vin is input to a base of the bipolar transistor M11, the input voltage Vin is compared with the capacitor voltage Vpeak of a capacitor C1. In a case where the input voltage Vin is larger than the capacitor voltage Vpeak, the bipolar transistor M12 becomes on, thereby a current flows through the bipolar transistor M12. When a current flows through the bipolar transistor M12, a current flows through the bipolar transistor M16 due to the current mirror operation of the bipolar transistors M15, M16. When a current flows through the bipolar transistor M16, a current flows through the bipolar transistor M18 due to the current mirror operation of the bipolar transistors M17, M18. When a current flows through the bipolar transistor M18, a current is supplied to the capacitor C1 and the capacitor C1 is charged until the capacitor voltage Vpeak becomes equal to a peak value of the input voltage Vin, thereby the peak value of the input voltage Vin is held in the capacitor C1.

Ninth Embodiment

Figures 1, 23:
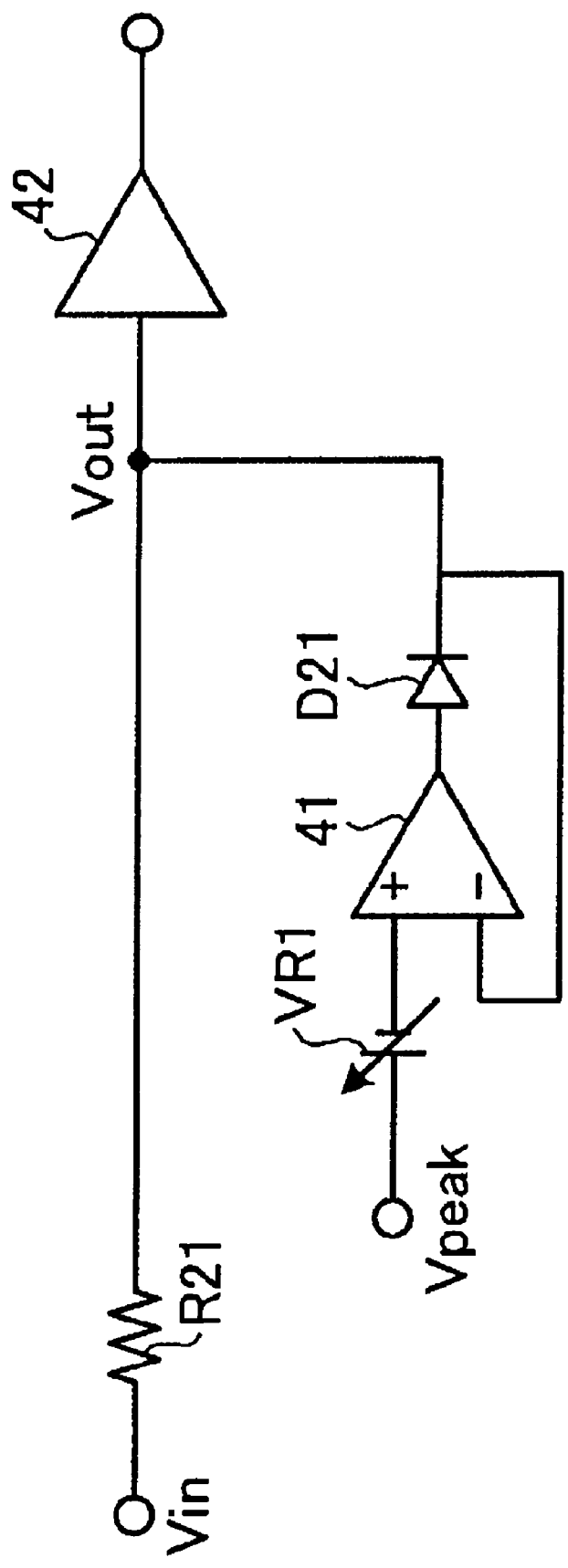
Figures 2, 23:
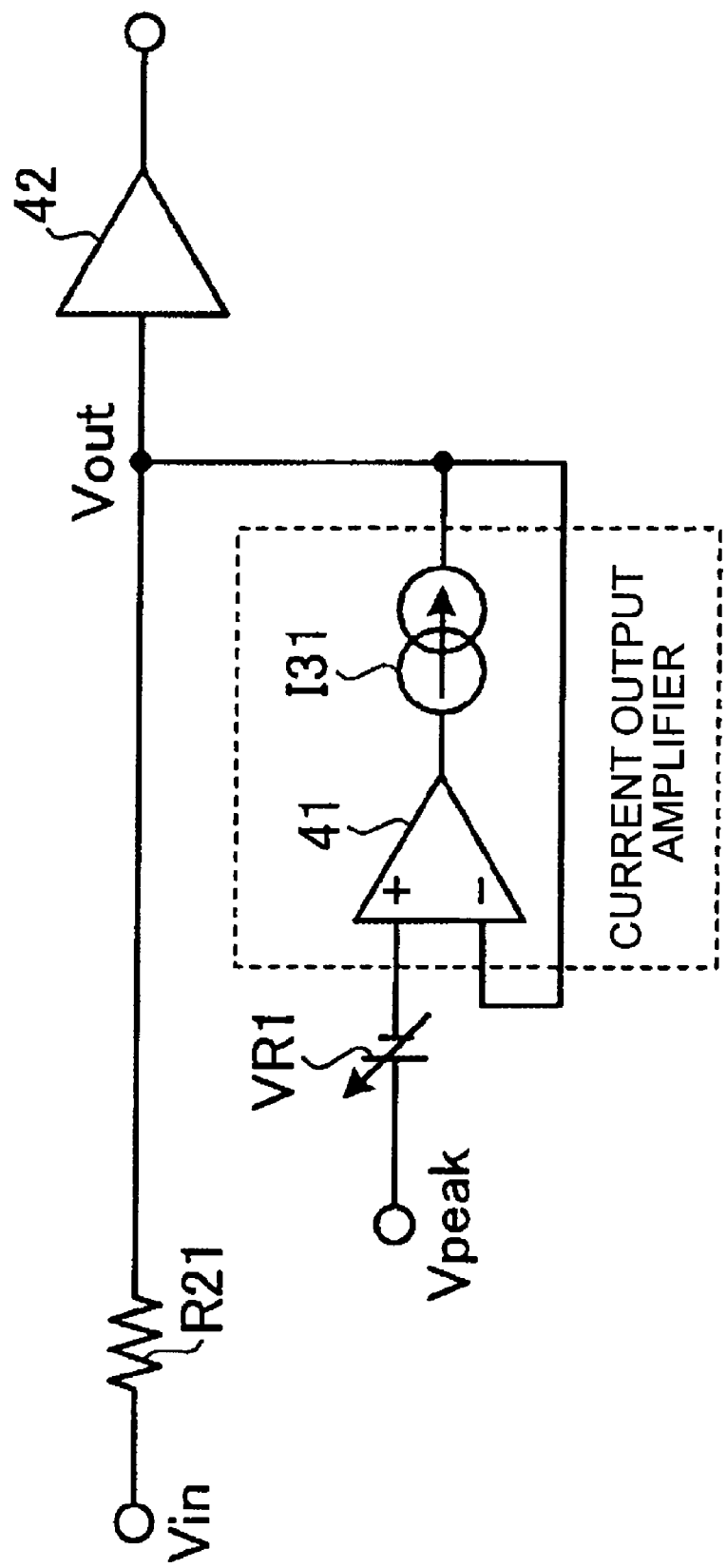

FIG. 23-1 is a circuit diagram showing a schematic configuration of a clipping circuit which is applied to a charge/discharge circuit of a ninth embodiment.

In FIG. 23-1, an output terminal of an operational amplifier 41 is connected to an inverting input terminal of the operational amplifier 41 via a diode D21, and a variable voltage source VR1 is connected to a non-inverting input terminal of the operational amplifier 41. A cathode terminal of the diode D21 is connected to a resistor 21 and a buffer 42 respectively.

After the capacitor voltage Vpeak of a capacitor C1 is caused to drop by a voltage corresponding to a voltage set in the variable voltage source VR1, the capacitor voltage Vpeak is input to the non-inverting input terminal of the operational amplifier 41. When the input voltage Vin is input to the non-inverting input terminal of the operational amplifier 41 via the resistor R21, the output voltage Vout is compared with the voltage caused to drop from the capacitor voltage Vpeak by a voltage corresponding to a voltage set in the variable voltage source VR1. When the output voltage Vout is lower than the voltage caused to drop from the capacitor voltage Vpeak by a voltage corresponding to a voltage set in the variable voltage source VR1, the operational amplifier 41 adjusts the voltage output so that the output voltage Vout becomes equal to the voltage caused to drop from the capacitor voltage Vpeak by a voltage corresponding to a voltage set in the variable voltage source VR1, thereby Level L of the output voltage Vout is clipped so that the amplitude of the output voltage Vout becomes constant.

Tenth Embodiment

FIG. 23-2 is a circuit diagram showing a schematic configuration of a clipping circuit which is applied to a charge/discharge circuit of a tenth embodiment.

In the clipping circuit of FIG. 23-2, a current supply circuit 131 is provided in place of the diode D21 of FIG. 23-1. When the output voltage Vout is lower than the voltage caused to drop from the capacitor voltage Vpeak by a voltage corresponding to a voltage set in the variable voltage source VR1, an operational amplifier 41 adjusts the current output so that the output voltage Vout becomes equal to the voltage caused to drop from the capacitor voltage Vpeak by a voltage corresponding to a voltage set in the variable voltage source VR1, thereby Level L of the output voltage Vout is clipped so that the amplitude of the output voltage Vout becomes constant.

Eleventh Embodiment

Figure 24:
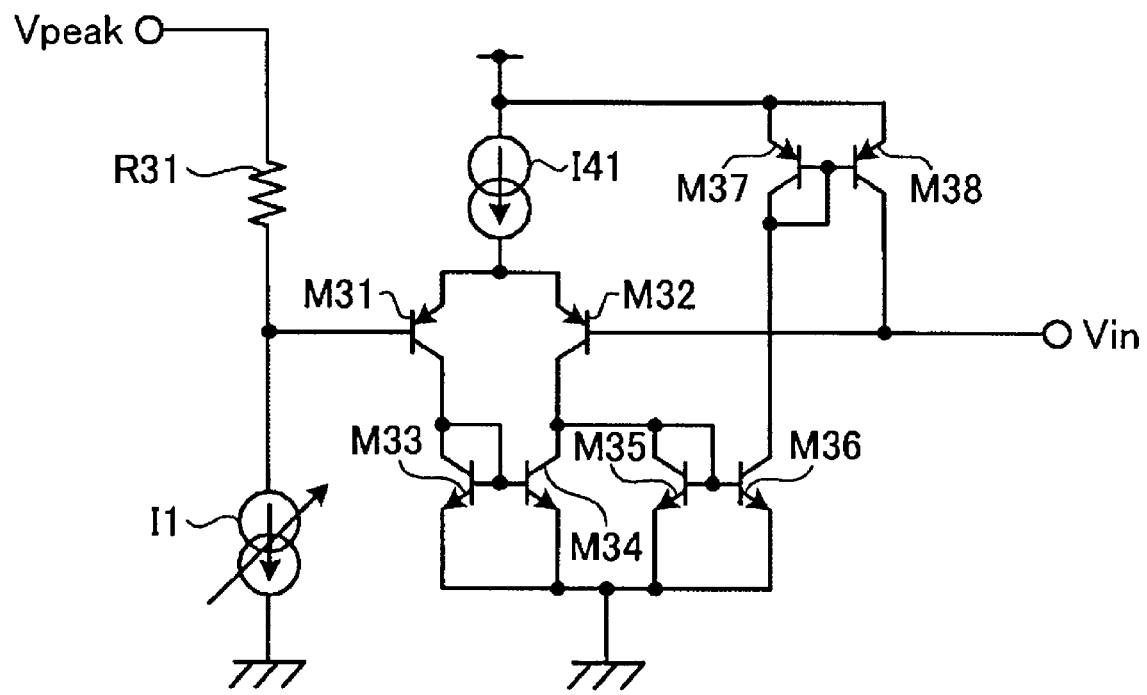
FIG. 24 is a circuit diagram showing a schematic configuration of a clipping circuit which is applied to a charge/discharge circuit of an eleventh embodiment.

FIG. 24 is a circuit diagram showing a schematic configuration of a clipping circuit which is applied to a charge/discharge circuit of an eleventh embodiment.

In FIG. 24, bipolar transistors M31, M32 constitute a differential amplifier, and a current source I41 is connected to collectors of the bipolar transistors M31, M32 as a common current source. Bipolar transistors M33, M34 constitute a current mirror for a current flowing through the bipolar transistor M31, bipolar transistors M35, M36 constitute a current mirror for a current flowing through the bipolar transistor M32, and bipolar transistors M37, M38 constitute a current mirror for a current flowing through the bipolar transistor M36. A current source I1 is connected to a resistor R31, and a base of the bipolar transistor M31 is connected to a connection point between the resistor R31 and the current source I1.

Incidentally, the PNP type can be used for the bipolar transistors M31, M32, M37, M38, and the NPN type can be used for the bipolar transistors M33, M34, M35, M36.

The capacitor voltage Vpeak is input to a base of the bipolar transistor M31 via the resistor R31. When the input voltage Vin is input to a base of the bipolar transistor M32, the input voltage Vin is compared with a voltage obtained by subtracting a voltage corresponding to a voltage drop caused by the resistor R31 from the capacitor voltage Vpeak. In a case where the input voltage Vin is smaller than the voltage obtained by subtracting a voltage corresponding to a voltage drop caused by the resistor R31 from the capacitor voltage Vpeak, the bipolar transistor M32 becomes on, thereby a current flows through the bipolar transistor M32. When a current flows through the bipolar transistor M32, a current flows through the bipolar transistor M36 due to the current mirror operation of the bipolar transistors M35, M36. When a current flows through the bipolar transistor M36, a current flows through the bipolar transistor M38 due to the current mirror operation of the bipolar transistors M37, M38. When a current flows through the bipolar transistor M38, the bipolar transistors M31, M32 operate in such a manner that the input voltage Vin becomes equal to the voltage obtained by subtracting a voltage corresponding to a voltage drop caused by the resistor R31 from the capacitor voltage Vpeak, thereby Level L of the input voltage Vin is clipped so that the amplitude of the input voltage Vin comes constant.

On the other hand, in a case where the input voltage Vin is larger than a voltage obtained by subtracting a voltage corresponding to a voltage drop caused by the resistor R31 from the capacitor voltage Vpeak, the bipolar transistor M31 becomes off, thereby a current flowing through the bipolar transistor M38 is cut off and the input voltage Vin is output as it is.

Twelfth Embodiment

Figure 25:
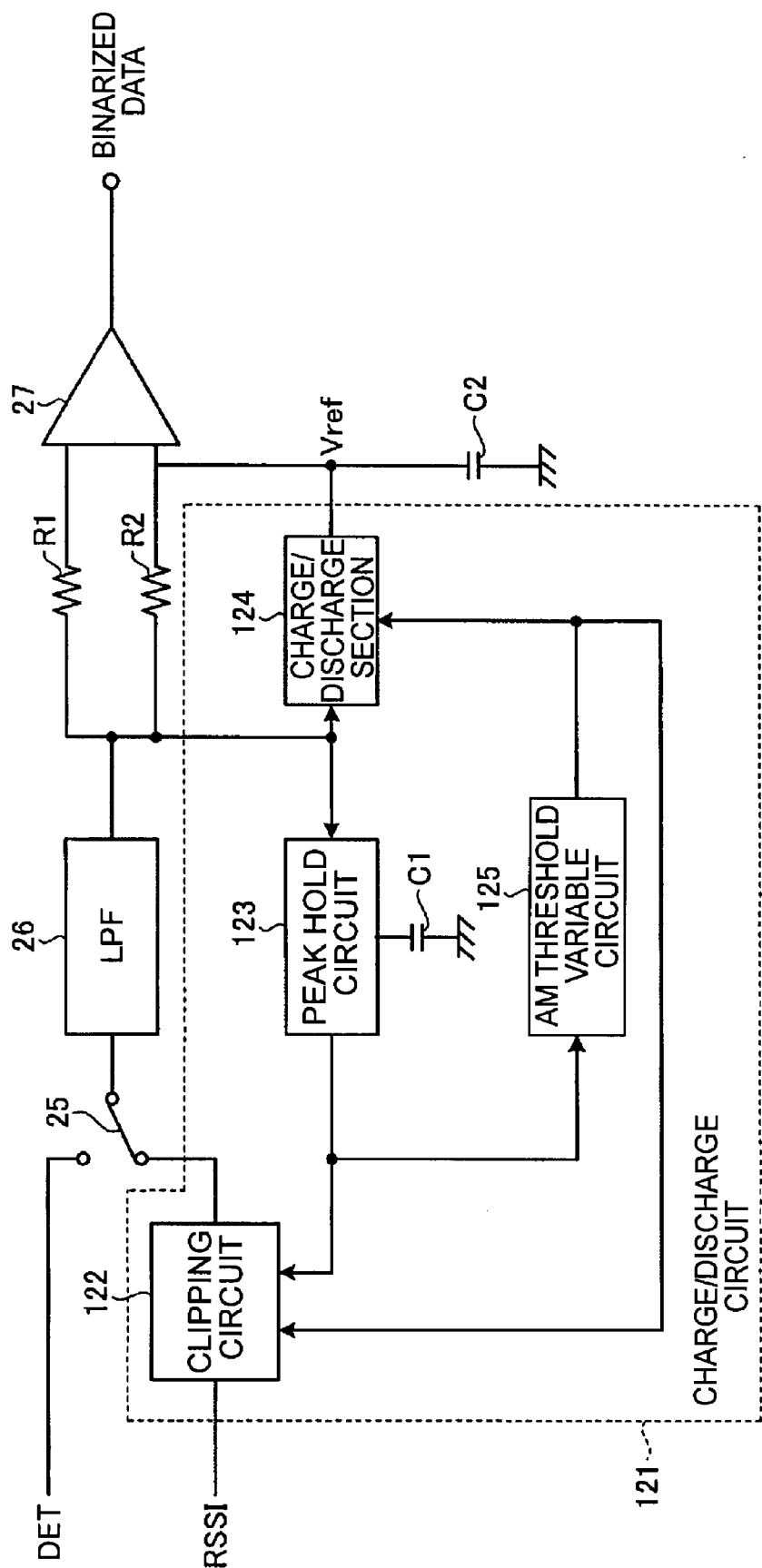
FIG. 25 is a block diagram showing a schematic configuration of a comparator circuit to which a charge/discharge circuit of a twelfth embodiment is applied.

FIG. 25 is a block diagram showing a schematic configuration of a comparator circuit to which a charge/discharge circuit of a twelfth embodiment is applied.

In FIG. 25, this comparator circuit is provided with a charge/discharge circuit 121 in place of the charge/discharge circuit 21 of FIG. 17, and the charge/discharge circuit 121 is provided with a clipping circuit 122, a peak hold circuit 123, a charge/discharge section 124, and an AM threshold variable circuit 125. The charge/discharge section 124 can charge/discharge a capacitor C2 on the basis of a driving voltage or a driving current generated according to results of a comparison between an input signal input to the charge/discharge section 124 and the reference voltage Vref. The peak hold circuit 123 can detect a peak value of the input signal input to the charge/discharge section 124 and is connected to the capacitor C1 that holds the peak value of the input signal. The clipping circuit 122 can clip a level lower than a given value, from the peak value of the input signal input to the charge/discharge section 124. The AM threshold variable circuit 125 can change the clipping level of the clipping circuit 122 on the basis of a peak value of an input signal detected by the peak hold circuit 123.

Figure 26:
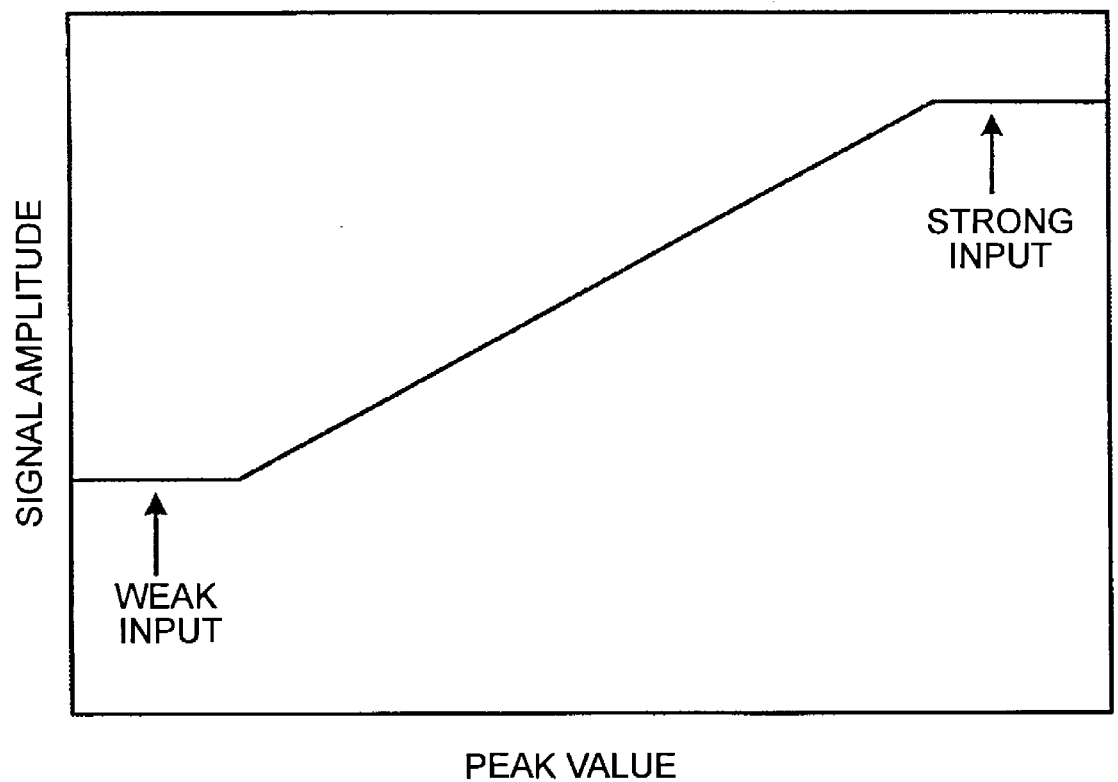
FIG. 26 is a diagram showing an example of the clipping level variable characteristics of the charge/discharge circuit in FIG. 25.

FIG. 26 is a diagram showing an example of the clipping level variable characteristics of the charge/discharge circuit by the AM threshold variable circuit 125 shown in FIG. 25.

In FIG. 26, the AM threshold variable circuit 125 can change the clipping level so that the signal amplitude increases with increasing peak value of an input signal.

When an FSK signal is received by the antenna 11 of FIG. 15, the switch 25 is changed over to the FM detector 16 side. After the removal of unnecessary high-frequency components in the low-pass filter 26, the FSK signal demodulated by the FM detector 16 is input to one input terminal of the comparator 27 via the resistor R1 and is input to the charge/discharge section 124. In the charge/discharge section 124, a comparison is made between the FSK signal and the reference voltage Vref, and a driving voltage or a driving current corresponding to results of the comparison is generated. The charge/discharge section 124 performs the charging/discharging of the capacitor C2 using the driving voltage or the driving current, thereby the charge/discharge section 124 causes a reference voltage Vref in which the FSK signal is smoothed to be generated in the capacitor C2.

The reference voltage Vref generated in the capacitor C2 is input to the other input terminal of the comparator 27 and compared with the FSK signal input via the resistor R1, thereby binarized data is generated.

On the other hand, when an ASK signal is received by the antenna 11, the switch 25 is changed over to the clipping circuit 122 side. After the removal of unnecessary high-frequency components in the low-pass filter 26, the ASK signal output via the clipping circuit 122 is input to one input terminal of the comparator 27 via the resistor R1 and is input to the peak hold circuit 123 and the charge/discharge section 124.

When the ASK signal is input to the peak hold circuit 123, a peak value of the ASK signal is detected and output to the clipping circuit 122 and the AM threshold variable circuit 125. The AM threshold variable circuit 125 adjusts the clipping level of the clipping circuit 122 on the basis of the peak value of the ASK signal and adjusts the level of the ASK signal input to the charge/discharge section 124.

Signals lower than the clipping level are clipped from the peak value of the ASK signal in the clipping circuit 122, thereby the amplitude of the ASK signal is equalized, and the ASK signal is input to the charge/discharge section 124 of the low-pass filter 26.

After the adjustment of the input level of the ASK signal in the charge/discharge section 124, a comparison with the reference voltage Vref is made, and a driving voltage or a driving current corresponding to results of the comparison is generated. The charge/discharge section 124 performs the charging/discharging of the capacitor C2 using the driving voltage or the driving current, thereby the charge/discharge section 124 causes a reference voltage Vref in which the ASK signal is smoothed to be generated in the capacitor C2.

The reference voltage Vref generated in the capacitor C2 is input to the other input terminal of the comparator 27 and compared with the ASK signal input via the resistor R1, thereby binarized data is generated.

Figures 1, 27:
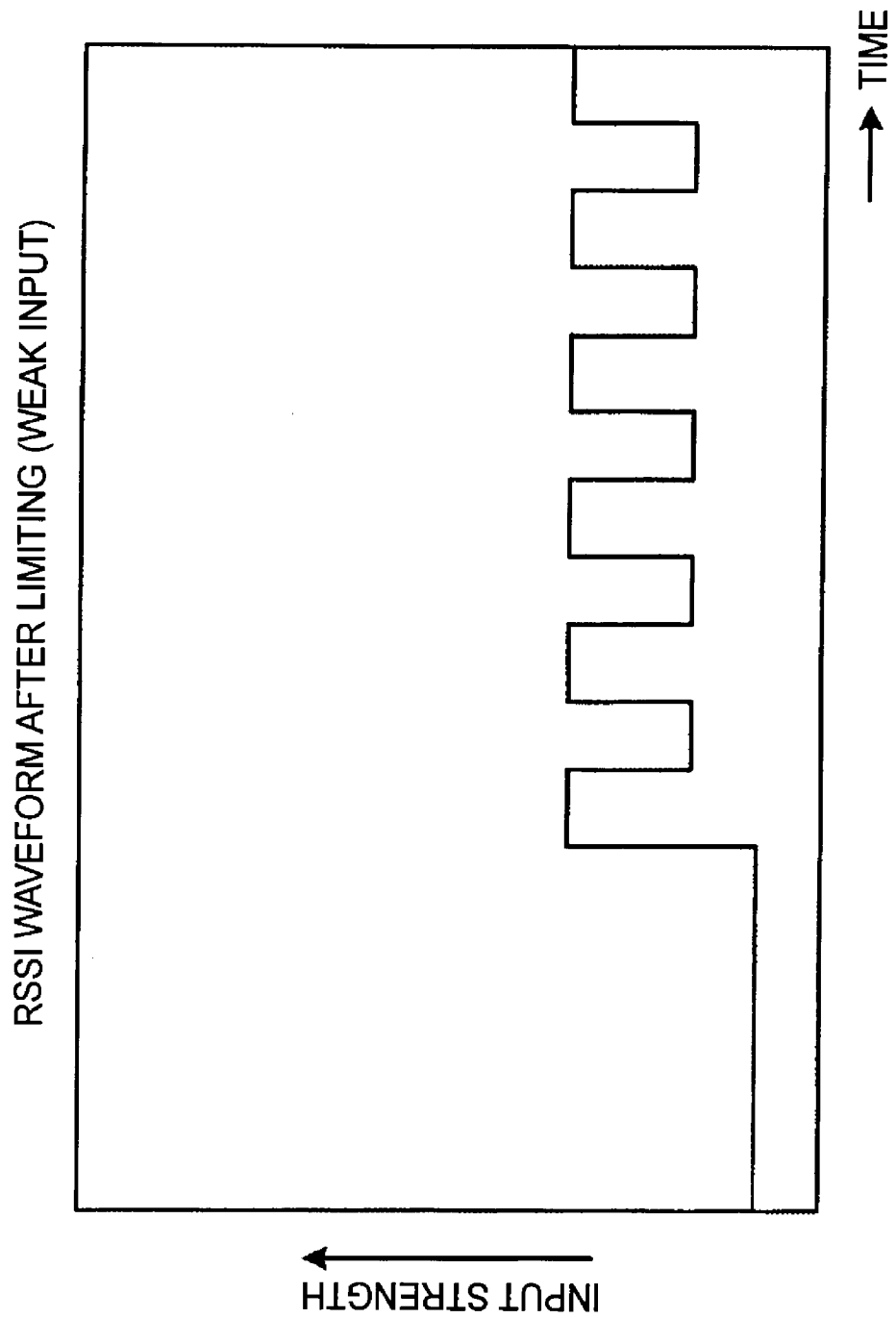
Figures 2, 27:
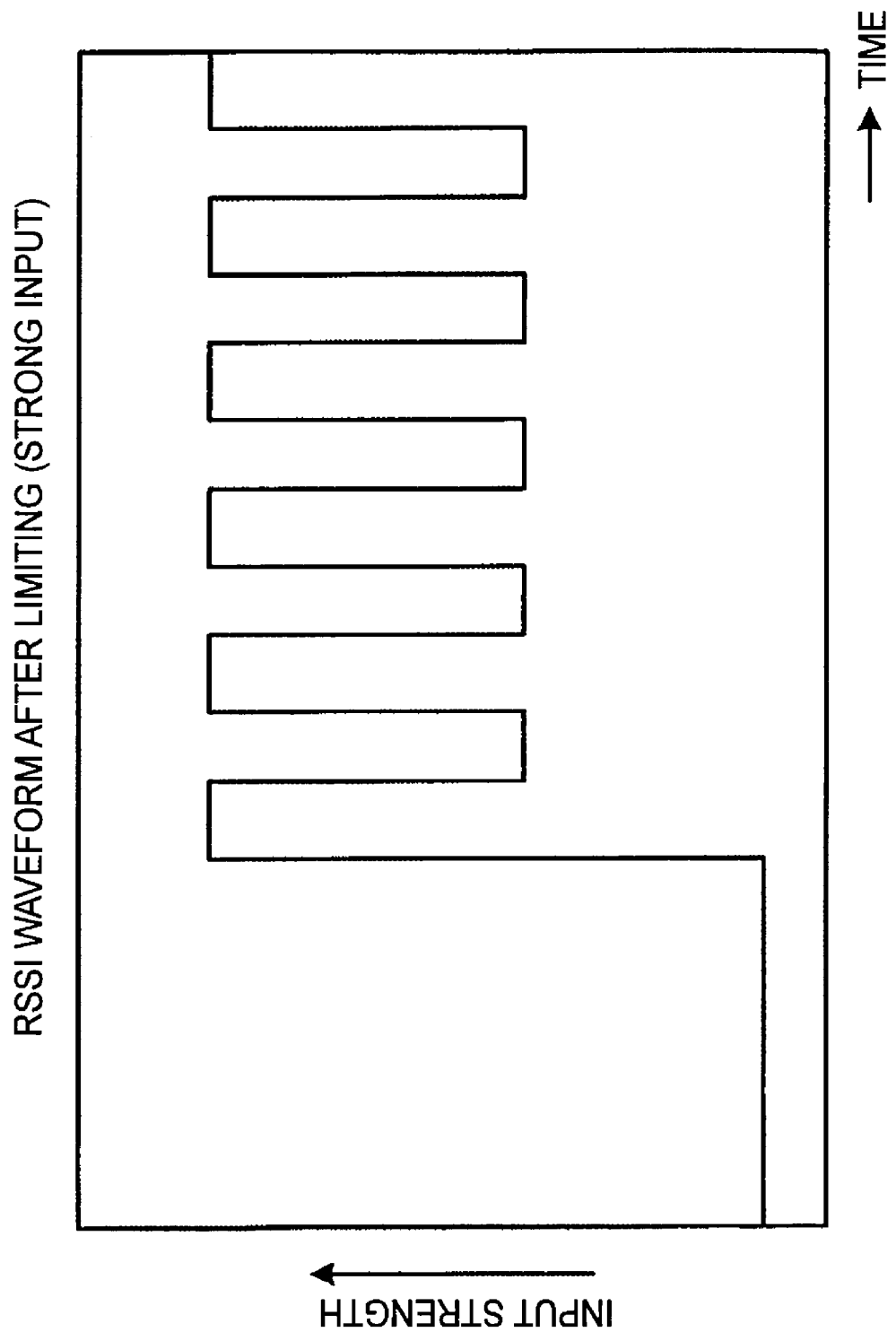

FIG. 27-1 is a diagram showing the RSSI waveform during a weak input after clipping in the charge/discharge circuit of FIG. 25. FIG. 27-2 is a diagram showing the RSSI waveform during a strong input after clipping in the charge/discharge circuit of FIG. 25.

As shown in FIG. 27-1, it is possible to ensure the amplitude of an input signal input to the charge/discharge section 124 by reducing the clipping level when the receiving level of an ASK signal is small, and when the receiving level of an ASK signal is large, it is possible to efficiently remove noise while permitting the enlargement of the amplitude of an input signal input to the charge/discharge section 124 by enlarging the clipping level.

Thirteenth Embodiment

Figures 1, 28:
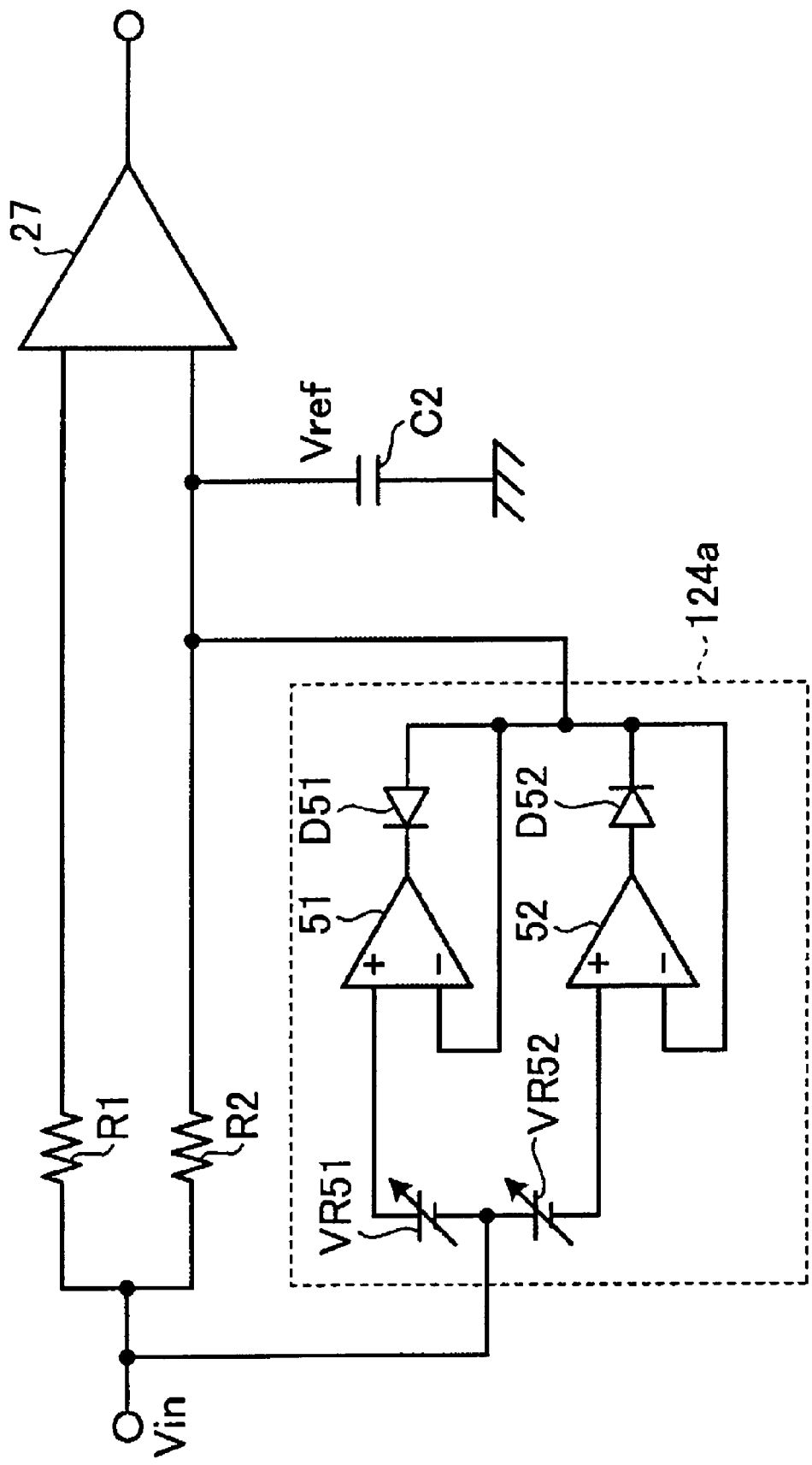
Figures 2, 28:
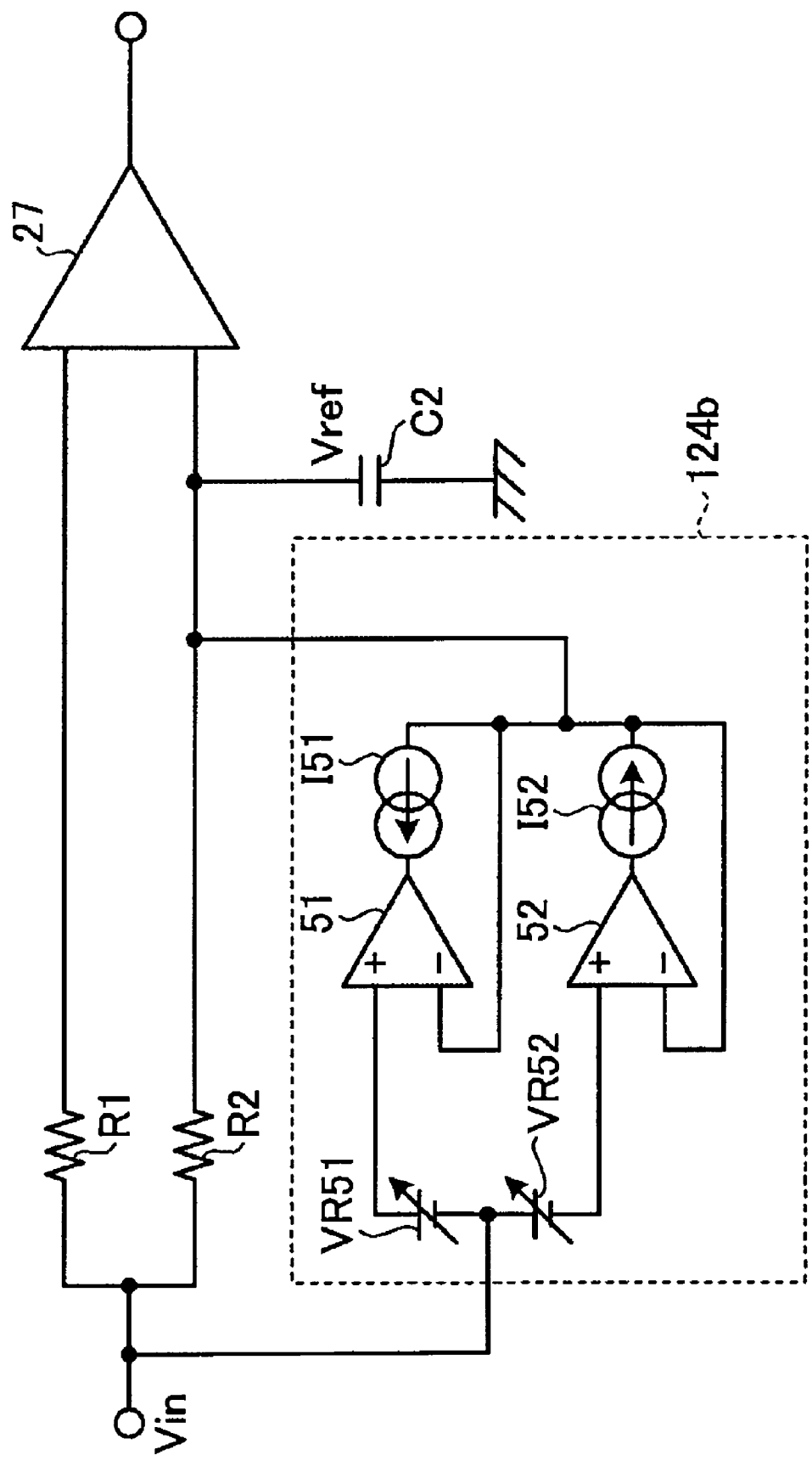

FIG. 28-1 is a circuit diagram showing a schematic configuration of a charge/discharge section which is applied to a charge/discharge circuit of a thirteenth embodiment.

In FIG. 28-1, the comparator circuit of FIG. 25 is provided with a charge/discharge section 124a as the charge/discharge section 124. In the charge/discharge section 124a, a non-inverting input terminal of an operational amplifier 51 is connected to a positive side terminal of a variable voltage source VR51, and an inverting input terminal of the operational amplifier 51 is connected to an anode terminal of a diode D51 and the capacitor C2, and an output terminal of the operation amplifier 51 is connected to a cathode terminal of the diode D51. A non-inverting terminal of an operational amplifier 52 is connected to a negative side terminal of a variable voltage source VR52, an inverting input terminal of the operational amplifier 52 is connected to a cathode terminal of a diode D52 and the capacitor C2, and an output terminal of the operational amplifier 51 is connected to an anode terminal of the diode D52. The negative side terminal of the variable voltage source VR51 and the positive side terminal of the variable voltage source VR52 are connected to a connection point between resistors R1 and R2.

After being raised by a voltage corresponding to a voltage change caused by the variable voltage source VR51, the input voltage Vin is input to the non-inverting terminal of the operational amplifier 51 and lowered by a voltage corresponding to a voltage change caused by the variable voltage source VR52. After that, the input voltage Vin is input to the non-inverting terminal of the operational amplifier 52. In the operational amplifier 51, a value obtained after raising the input voltage Vin by a voltage change caused by the variable voltage source VR51 is compared with the reference voltage Vref. When the value obtained after raising the input voltage Vin by a voltage change caused by the variable voltage source VR51 is smaller than the reference voltage Vref, the voltage output of the operational amplifier 51 is adjusted and a current is caused to flow from the capacitor C2 via the diode D51, thereby the reference voltage Vref is caused to drop.

On the other hand, in the operational amplifier 52, a value obtained after lowering the input voltage Vin by a voltage change caused by the variable voltage source VR52 is compared with the reference voltage Vref. When the value obtained after lowering the input voltage Vin by a voltage change caused by the variable voltage source VR52 is larger than the reference voltage Vref, the voltage output of the operational amplifier 52 is adjusted and a current is caused to flow into the capacitor C2 via the diode D52, thereby the reference voltage Vref is caused to rise.

When the AM threshold variable circuit 125 of FIG. 25 changes the clipping level of the clipping circuit 122, the AM threshold variable circuit 125 changes the voltage of the variable voltage sources VR51, VR52 according to a change in the clipping level, and can change the level of the input voltage Vin in this manner.

Fourteenth Embodiment

FIG. 28-2 is a circuit diagram showing a schematic configuration of a charge/discharge section which is applied to a charge/discharge circuit of a fourteenth embodiment.

In FIG. 28-2, the comparator circuit of FIG. 25 is provided with a charge/discharge section 124b as the charge/discharge section 124. The charge/discharge section 124b is provided with current supply circuits I51, I52 in place of the diodes D51, D52, respectively, of FIG. 28-1.

After being raised by a voltage corresponding to a voltage change caused by the variable voltage source VR51, the input voltage Vin is input to the non-inverting terminal of the operational amplifier 51 and lowered by a voltage corresponding to a voltage change caused by the variable voltage source VR52. After that, the input voltage Vin is input to the non-inverting terminal of the operational amplifier 52. In the operational amplifier 51, a value obtained after raising the input voltage Vin by a voltage change caused by the variable voltage source VR51 is compared with the reference voltage Vref. When the value obtained after raising the input voltage Vin by a voltage change caused by the variable voltage source VR51 is smaller than the reference voltage Vref, the current output of the operational amplifier 51 is adjusted and a current is caused to flow from the capacitor C2 via the current supply circuit I51, thereby the reference voltage Vref is caused to drop.

On the other hand, in the operational amplifier 52, a value obtained after lowering the input voltage Vin by a voltage change caused by the variable voltage source VR52 is compared with the reference voltage Vref. When the value obtained after lowering the input voltage Vin by a voltage change caused by the variable voltage source VR52 is larger than the reference voltage Vref, the current output of the operational amplifier 52 is adjusted and a current is caused to flow into the capacitor C2 via the current supply circuit I52, thereby the reference voltage Vref is caused to rise.

Fifteenth Embodiment

Figure 29:
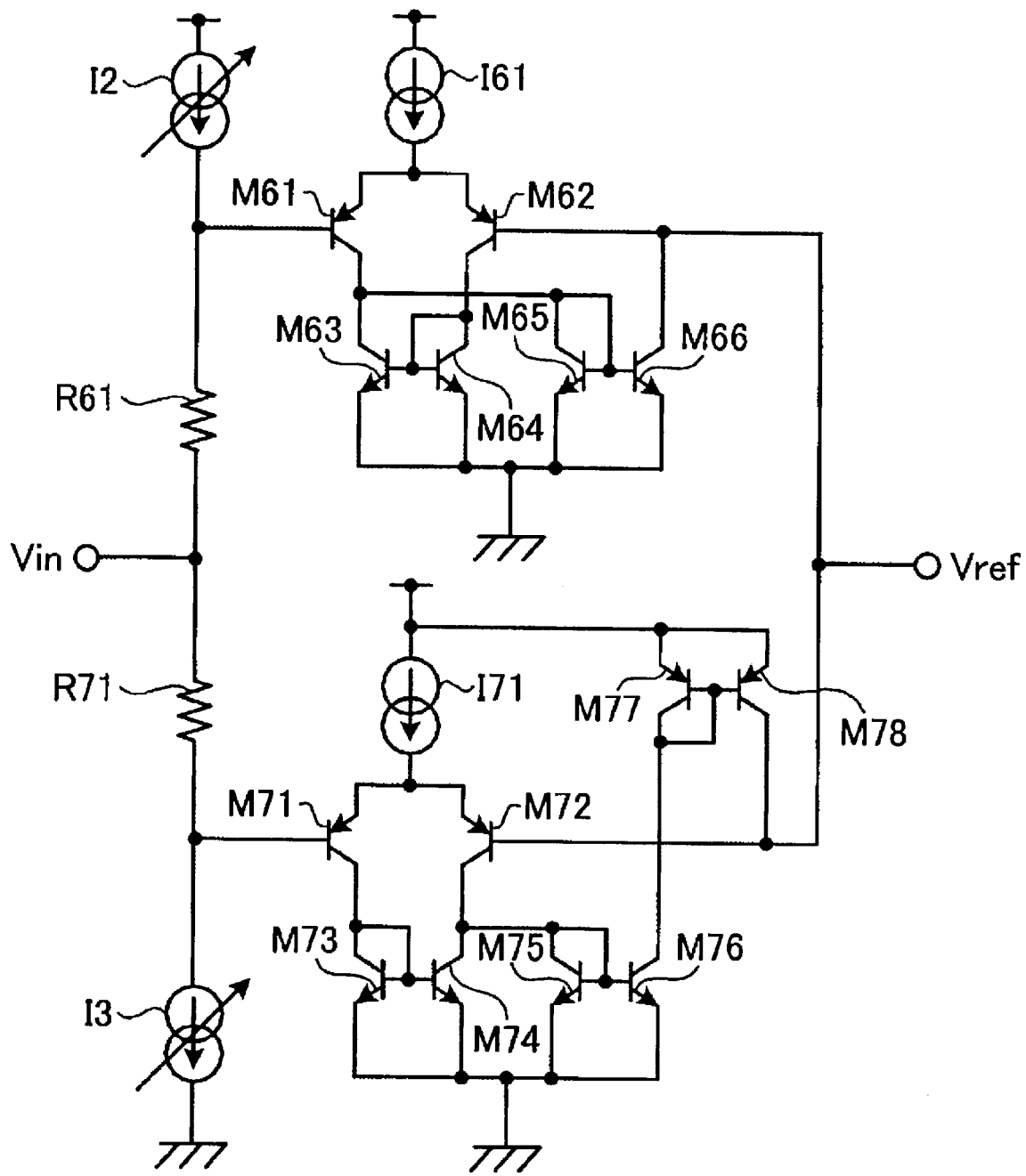
FIG. 29 is a circuit diagram showing a schematic configuration of a charge/discharge section which is applied to a charge/discharge circuit of a fifteenth embodiment.

FIG. 29 is a circuit diagram showing a schematic configuration of a charge/discharge section which is applied to a charge/discharge circuit of a fifteenth embodiment.

In FIG. 29, bipolar transistors M61, M62 constitute a differential amplifier, and a current source I61 is connected to collectors of the bipolar transistors M61, M62 as a common current source. Bipolar transistors M63, M64 constitute a current mirror for a current flowing through the bipolar transistor M62, and bipolar transistors M65, M66 constitute a current mirror for a current flowing through the bipolar transistor M61.

Bipolar transistors M71, M72 constitute a differential amplifier, and a current source I71 is connected to collectors of the bipolar transistors M71, M72 as a common current source. Bipolar transistors M73, M74 constitute a current mirror for a current flowing through the bipolar transistor M71, bipolar transistors M75, M76 constitute a current mirror for a current flowing through the bipolar transistor M72, and bipolar transistors M77, M78 constitute a current mirror for a current flowing through the bipolar transistor M76.

A current source I2, resistors R61, R71 and a current source I3 are sequentially connected in series, a base of the bipolar transistor M61 is connected to a connection point between the current source I2 and the resistor R61, and a base of the bipolar transistor M71 is connected to a connection point between the current source I3 and the resistor 71.

Incidentally, the PNP type can be used for the bipolar transistors M61, M62, M71, M72, M77, M78 and the NPN type can be used for the bipolar transistors M63, M64, M65, M66, M73, M74, M75, M76.

When the input voltage Vin is input to bases of the bipolar transistors M61, M71 via the resistors R61, R71, respectively, a voltage caused to rise from the input voltage Vin by a voltage corresponding to a voltage drop caused by the resistors R61 is input to the base of the bipolar resistor M61, and a voltage caused to drop from the input voltage Vin by a voltage corresponding to a voltage drop caused by the resistors R71 is input to the base of the bipolar resistor M71. The reference voltage Vref is input to bases of the bipolar transistors M62, M72.

When a voltage caused to rise from the input voltage Vin by a voltage corresponding to a voltage drop caused by the resistors R61 is input to the base of the bipolar resistor M61, this voltage is compared with the reference voltage Vref in the bipolar transistors M61, M62. When the voltage caused to rise from the input voltage Vin by a voltage corresponding to a voltage drop caused by the resistors R61 is smaller than the reference voltage Vref, the bipolar transistor M61 becomes on, thereby a current flows through the bipolar transistor M61. When a current flows through the bipolar transistor M61, a current flows through the bipolar transistor M66 by the current mirror operation of the bipolar transistors M65, M66. When a current flows through the bipolar transistor M66, a current is drawn form the capacitor C2 of FIG. 25 and this causes the reference voltage Vref to drop.

On the other hand, when a voltage caused to drop from the input voltage Vin by a voltage corresponding to a voltage drop caused by the resistors R71 is input to the base of the bipolar resistor M71, this voltage is compared with the reference voltage Vref in the bipolar transistors M71, M72. When the voltage caused to drop from the input voltage Vin by a voltage corresponding to a voltage drop caused by the resistors R71 is larger than the reference voltage Vref, the bipolar transistor M72 becomes on, thereby a current flows through the bipolar transistor M72. When a current flows through the bipolar transistor M72, a current flows through the bipolar transistor M76 by the current mirror operation of the bipolar transistors M75, M76. When a current flows through the bipolar transistor M76, a current flows through the bipolar transistor M78 by the current mirror operation of the bipolar transistors M77, M78. When a current flows through the bipolar transistor M78, a current is supplied to the capacitor C2 of FIG. 25 and this causes the reference voltage to rise.

When the AM threshold variable circuit 125 of FIG. 25 changes the clipping level of the clipping circuit 122, the AM threshold variable circuit 125 changes the currents of the current sources I2, I3 respectively according to a change in the clipping level, thereby the threshold variable circuit 125 changes voltages corresponding to voltage drops caused by the resistors R61, R71 and can change the level of the input voltage Vin in this manner.

Sixteenth Embodiment

Figure 30:
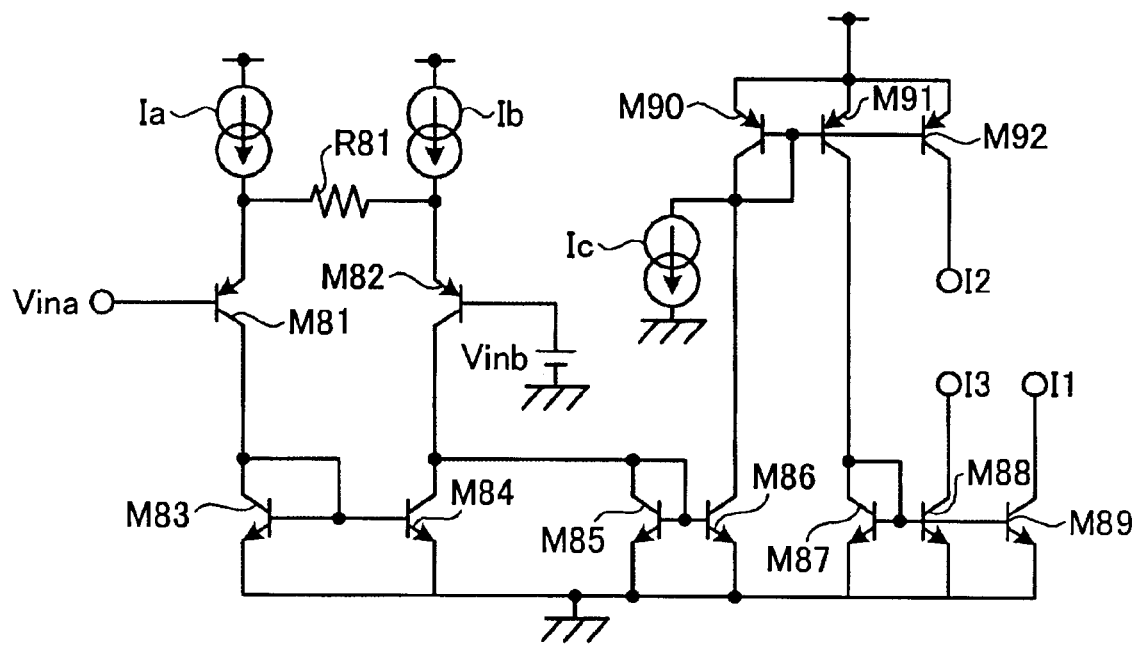
FIG. 30 is a circuit diagram showing a schematic configuration of a threshold variable circuit which is applied to a charge/discharge circuit of a sixteenth embodiment.

FIG. 30 is a circuit diagram showing a schematic configuration of a threshold variable circuit which is applied to a charge/discharge circuit of a sixteenth embodiment.

In FIG. 30, bipolar transistors M81, M82 constitute a differential amplifier, a current source Ia is connected to a collector of the bipolar transistor M81, and a current source Ib is connected to a collector of the bipolar transistor M82. A resistor R81 is connected to between the collectors of the bipolar transistors M81, M82.

Bipolar transistors M83, M84 constitute a current mirror for a current flowing through the bipolar transistor M81, bipolar transistors M85, M86 constitute a current mirror for a current flowing through the bipolar transistor M82, bipolar transistors M90 to M92 constitute a current mirror for a current flowing through the bipolar transistor M86, and bipolar transistors M87 to M89 constitute a current mirror for a current flowing through the bipolar transistor M91.

A voltage source Vinb is connected to a base of the bipolar transistor M82, and a current source Ic is connected to a collector of the bipolar transistor M90. A collector terminal of the bipolar transistor M89 can be used as the current source I1 of FIG. 24, a collector terminal of the bipolar transistor M92 can be used as the current source I2 of FIG. 29, and a collector terminal of the bipolar transistor M88 can be used as the current source I3 of FIG. 29.

Incidentally, the PNP type can be used for the bipolar transistors M81, M82, M90 to M92, and the NPN type can be used for the bipolar transistors M83 to M89.

When the input voltage Vina is input to a base of the bipolar transistor M81, the input voltage Vina is compared with the voltage of the voltage source Vinb. Incidentally, the output of the peak hold circuit 123 of FIG. 25 can be used as the input voltage Vina. When the input voltage Vina is larger than the voltage of the voltage source Vinb, the bipolar transistor M82 becomes on, thereby a current flows through the bipolar transistor M82. When a current flows through the bipolar transistor M82, a current flows through the bipolar transistor M86 by the current mirror operation of the bipolar transistors M85, M86. When a current flows through the bipolar transistor M86, a current flows through the bipolar transistors M91, M92 by the current mirror operation of the bipolar transistors M90 to M92. When a current flows through the bipolar transistor M91, a current flows through the bipolar transistors M88, M89 by the current mirror operation of the bipolar transistors M87 to M89.

When a current flows through the bipolar transistor M89, a current flows through the current source I1 of FIG. 24 and a voltage drop by the resistor R31 increases, thereby the clipping level lowers and it is possible to increase the amplitude of the input voltage Vin.

When a current flows through the bipolar transistor M92, a current flows through the current source I2 of FIG. 29 and the voltage drop by the resistor R61 increases, thereby it is possible to lower the level of the input voltage Vin when a current is drawn from the capacitor C2 of FIG. 25.

When a current flows through the bipolar transistor M88, a current flows through the current source I3 of FIG. 29 and the voltage drop by the resistor R71 increases, thereby it is possible to raise the level of the input voltage Vin when a current is caused to flow into the capacitor C2 of FIG. 25.

Seventeenth Embodiment

Figure 31:
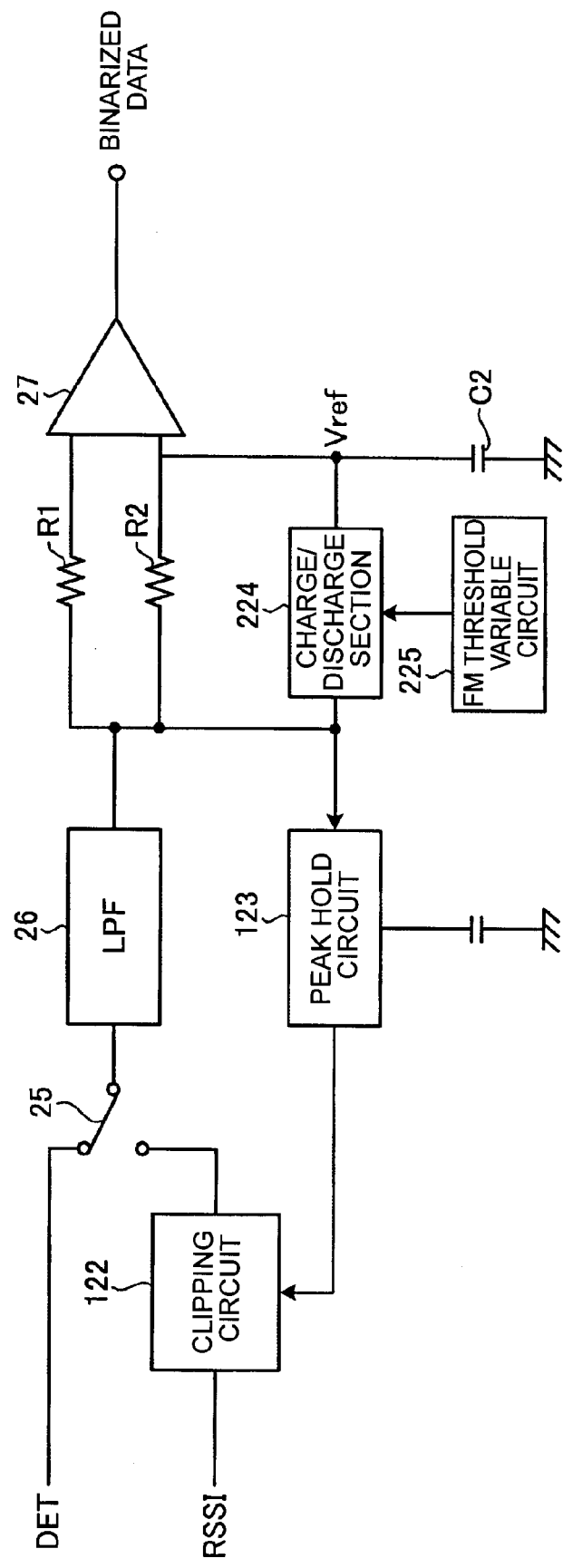
FIG. 31 is a block diagram showing a schematic configuration of a comparator circuit to which a charge/discharge circuit of a seventeenth embodiment is applied.

FIG. 31 is a block diagram showing a schematic configuration of a comparator circuit to which a charge/discharge circuit of a seventeenth embodiment is applied.

In FIG. 31, this comparator circuit is provided with a charge/discharge section 224 and an FM threshold variable circuit 225 in place of the charge/discharge section 124 and the AM threshold variable circuit 125. The charge/discharge section 224 can charge/discharge the capacitor C2 on the basis of a driving voltage or a driving current generated according to results of a comparison between an input signal input to the charge/discharge section 224 and the reference voltage Vref. The FM threshold variable circuit 225 can change a threshold that causes the charge/discharge section 224 to start the charging/discharging of the capacitor C2.

When an FSK signal is received by the antenna 11 of FIG. 15, a switch 25 is changed over to the FM detector 16 side. After the removal of unnecessary high-frequency components in the low-pass filter 26, an FSK signal demodulated in the FM detector 16 is input to one input terminal of a comparator 27 via a resistor R1 and input to the charge/discharge section 224. In the charge/discharge section 224, an amount corresponding to a threshold set in the FM threshold variable circuit 225 is added to an FSK signal or deducted from the FSK signal, and a comparison is made between an FSK signal to which the amount corresponding to a threshold is added or from which the amount corresponding to a threshold is deducted and the reference voltage Vref, thereby a driving voltage or a driving current is generated according to results of the comparison. The charge/discharge section 224 performs the charging/discharging of the capacitor C2 using the driving voltage or the driving current, thereby charge/discharge section 224 causes the capacitor C2 to generate a reference voltage Vref in which the FSK signal is smoothed.

The reference voltage Vref generated in the capacitor C2 is input to the other input terminal of the comparator 27 and compared with the FSK signal input via the resistor R1, thereby binarized data is generated.

The above-described embodiments are all illustrative only, do not restrict the present invention, and may be modified within the technical scope of the present invention in various forms.

The invention claimed is:

1. A comparator circuit comprising:
   a comparator comprising first and second input terminals, and configured to compare a signal inputted to the first input terminal with a signal inputted to the second input terminal;
   a first resistor comprising a first end to which a signal from outside is inputted, and a second end electrically connected to the first input terminal;
   a second resistor comprising a third end to which the signal from outside is inputted, and a fourth end electrically connected to the second input terminal;
   first and second voltage sources electrically connected to each other in series, the first voltage source comprising fifth and sixth ends, the second voltage source comprising seventh and eighth ends, and the sixth and seventh ends being connected to a first shared connection point to which the signal from outside is inputted;
   a first operational amplifier comprising third and fourth input terminals and a first output terminal, the third input terminal being connected to the fifth end;
   a first diode comprising a cathode connected to the first output terminal, and an anode connected to the fourth input terminal;
   a second operational amplifier comprising fifth and sixth input terminals and a second output terminal, the fifth input terminal being connected to the eighth end;
   a second diode comprising an anode connected to the second output terminal, and a cathode connected to the sixth input terminal, the anode of the first diode and the cathode of the second diode being connected to a second shared connection point, and the second shared connection point being connected to a node between the fourth end of the second resistor and the second input terminal of the comparator; and
   a capacitor comprising a ninth end connected to a ground terminal, and a tenth end connected to a node between the second shared connection point and the second input terminal of the comparator,
   wherein the first and second voltage sources, the first and second operational amplifiers, and the first and second diodes collectively form a charge/discharge circuit, and
   wherein the second resistor is connected in parallel with respect to the charge/discharge circuit.

2. The comparator circuit according to claim 1, wherein the first and second voltage sources are configured to be capable of setting a voltage between the fifth and sixth ends of the first voltage source, and a voltage between the seventh and eighth ends of the second voltage source to arbitrary values, respectively.

3. The comparator circuit according to claim 1, wherein the first and second voltage sources are variable voltage sources.

4. The comparator circuit according to claim 1, wherein the charge/discharge circuit only operates when the signal from outside is greater than a predetermined amplitude.

5. A comparator circuit comprising:
   a comparator comprising first and second input terminals, and configured to compare a signal inputted to the first input terminal with a signal inputted to the second input terminal;
   a first resistor comprising a first end to which a signal from outside is inputted, and a second end electrically connected to the first input terminal;
   a second resistor comprising a third end to which the signal from outside is inputted, and a fourth end electrically connected to the second input terminal;
   first and second voltage sources electrically connected to each other in series, the first voltage source comprising fifth and sixth ends, the second voltage source comprising seventh and eighth ends, and the sixth and seventh ends being connected to a first shared connection point to which the signal from outside is inputted;
   a first current output amplifier comprising third and fourth input terminals and a first output terminal, the third input terminal being connected to the fifth end;
   a second current output amplifier comprising fifth and sixth input terminals and a second output terminal, the fifth input terminal being connected to the eighth end, the fourth and sixth input terminals and the first and second output terminals being connected to a second shared connection point, and the second shared connection point being connected to a node between the fourth end of the second resistor and the second input terminal of the comparator; and
   a capacitor comprising a ninth end connected to a ground terminal, and a tenth end connected to a node between the second shared connection point and the second input terminal of the comparator,
   wherein the first and second voltage sources and the first and second current output amplifiers collectively form a charge/discharge circuit, and
   wherein the second resistor is connected in parallel with respect to the charge/discharge circuit.

6. The comparator circuit according to claim 5, wherein the first and second voltage sources are configured to be capable of setting a voltage between the fifth and sixth ends of the first voltage source, and a voltage between the seventh and eighth ends of the second voltage source to arbitrary values, respectively.

7. The comparator circuit according to claim 5, wherein the first and second voltage sources are variable voltage sources.

8. The comparator circuit according to claim 5, wherein the charge/discharge circuit only operates when the signal from outside is greater than a predetermined amplitude.

9. A radio communication apparatus comprising:
- an antenna configured to receive a radio signal from outside;
- a low-noise amplifier configured to amplify the radio signal;
- a mixer configured to vary a frequency of a signal outputted from the low-noise amplifier;
- a first filter configured to extract a signal containing a predetermined frequency band from a signal outputted from the mixer;
- an amplifier configured to amplify a signal outputted from the first filter;
- a demodulator configured to demodulate a signal outputted from the amplifier;
- a second filter configured to extract a signal containing a predetermined frequency band from a signal outputted from the demodulator; and
- a comparator circuit comprising:
  - a comparator comprising first and second input terminals, and configured to compare a signal inputted to the first input terminal with a signal inputted to the second input terminal;
  - a first resistor comprising a first end to which a signal from outside is inputted, and a second end electrically connected to the first input terminal;
  - a second resistor comprising a third end to which the signal from outside is inputted, and a fourth end electrically connected to the second input terminal;
  - first and second voltage sources electrically connected to each other in series, the first voltage source comprising fifth and sixth ends, the second voltage source comprising seventh and eighth ends, and the sixth and seventh ends being connected to a first shared connection point to which the signal from outside is inputted;
  - a first operational amplifier comprising third and fourth input terminals and a first output terminal, the third input terminal being connected to the fifth end;
  - a first diode comprising a cathode connected to the first output terminal, and an anode connected to the fourth input terminal;
  - a second operational amplifier comprising fifth and sixth input terminals and a second output terminal, the fifth input terminal being connected to the eighth end;
  - a second diode comprising an anode connected to the second output terminal, and a cathode connected to the sixth input terminal, the anode of the first diode and the cathode of the second diode being connected to a second shared connection point, and the second shared connection point being connected to a node between the fourth end of the second resistor and the second input terminal of the comparator; and
  - a capacitor comprising a ninth end connected to a ground terminal, and a tenth end connected to a node between the second shared connection point and the second input terminal of the comparator,
- wherein the first and second voltage sources, the first and second operational amplifiers, and the first and second diodes collectively form a charge/discharge circuit, and
- wherein the second resistor is connected in parallel with respect to the charge/discharge circuit,
- the comparator circuit configured to output a digital signal generated by using a signal outputted from the second filter, the signal outputted from the second filter being inputted to the first end of the first resistor, the third end of the second resistor, and the first shared connection point.

* * * * *